(12) United States Patent
Rantala et al.

(10) Patent No.: US 10,502,995 B2
(45) Date of Patent: Dec. 10, 2019

(54) DIELECTRIC SILOXANE PARTICLE FILMS, AND DEVICES HAVING THE SAME

(71) Applicant: Inkron Oy, Espoo (FI)

(72) Inventors: Juha Rantala, Espoo (FI); Jarkko Heikkinen, Espoo (FI); Janne Kylmä, Espoo (FI)

(73) Assignee: Inkron Oy, Espoo (FI)

( * ) Notice: Subject to any disclaimer, the term of this patent is extended or adjusted under 35 U.S.C. 154(b) by 41 days.

(21) Appl. No.: 15/319,818

(22) PCT Filed: Jun. 22, 2015

(86) PCT No.: PCT/FI2015/050456
§ 371 (c)(1),
(2) Date: Dec. 19, 2016

(87) PCT Pub. No.: WO2015/193557
PCT Pub. Date: Dec. 23, 2015

(65) Prior Publication Data
US 2017/0131591 A1    May 11, 2017

Related U.S. Application Data

(60) Provisional application No. 62/014,149, filed on Jun. 19, 2014.

(30) Foreign Application Priority Data

Jun. 19, 2014   (FI) .................................... 20145605

(51) Int. Cl.
| | | |
|---|---|---|
| G02F 1/1333 | (2006.01) |
| C09D 7/40 | (2018.01) |
| C09D 7/61 | (2018.01) |
| C08L 83/06 | (2006.01) |
| H01L 33/56 | (2010.01) |
| C08G 77/14 | (2006.01) |
| C08G 77/00 | (2006.01) |
| C08K 3/22 | (2006.01) |
| C08K 3/28 | (2006.01) |
| C09D 5/00 | (2006.01) |
| C09D 183/06 | (2006.01) |
| C09J 7/00 | (2018.01) |
| C09J 9/00 | (2006.01) |
| C09J 11/04 | (2006.01) |
| G06F 3/044 | (2006.01) |
| H01L 27/32 | (2006.01) |
| H01L 51/52 | (2006.01) |
| C08L 83/00 | (2006.01) |
| C08G 77/62 | (2006.01) |
| C08G 77/18 | (2006.01) |
| C08G 77/20 | (2006.01) |

(Continued)

(52) U.S. Cl.
CPC ....... *G02F 1/133345* (2013.01); *C08G 77/14* (2013.01); *C08G 77/80* (2013.01); *C08K 3/22* (2013.01); *C08K 3/28* (2013.01); *C08L 83/00* (2013.01); *C08L 83/06* (2013.01); *C09D 5/00* (2013.01); *C09D 7/61* (2018.01); *C09D 7/67* (2018.01); *C09D 183/06* (2013.01); *C09J 7/00* (2013.01); *C09J 9/00* (2013.01); *C09J 11/04* (2013.01); *G02F 1/13338* (2013.01); *G06F 3/044* (2013.01); *H01L 27/323* (2013.01); *H01L 33/56* (2013.01); *H01L 51/5246* (2013.01); *C08G 77/18* (2013.01); *C08G 77/20* (2013.01); *C08G 77/62* (2013.01); *C08K 2003/2244* (2013.01); *C08K 2201/005* (2013.01); *C09J 183/06* (2013.01); *G02F 2202/023* (2013.01); *G02F 2202/28* (2013.01); *G02F 2202/36* (2013.01); *G06F 3/0412* (2013.01); *H01L 2251/30* (2013.01); *H01L 2251/5369* (2013.01)

(58) Field of Classification Search
CPC ....... C08G 77/02; C08G 77/045; C08G 77/08
See application file for complete search history.

(56) References Cited

U.S. PATENT DOCUMENTS

| 5,645,901 A | 7/1997 | Fukuchi et al. | |
| 6,099,971 A * | 8/2000 | Faris ....................... | B05D 7/53 |
| | | | 106/287.16 |
| 6,984,483 B1 | 1/2006 | Roscher et al. | |

(Continued)

FOREIGN PATENT DOCUMENTS

| CN | 101111580 A | 1/2008 |
| CN | 102472964 A | 5/2012 |

(Continued)

OTHER PUBLICATIONS

McLachlan D S et al: Electrical resistivity of composites. A Journal of the American Ceramic Society USA, vol. 73, No. 8, Aug. 1998, pp. 2187-2283 + p. 2196; formula (10).

*Primary Examiner* — Marc S Zimmer
(74) *Attorney, Agent, or Firm* — Seppo Laine Oy

(57) ABSTRACT

A method for making a dielectric film includes a substrate on which is deposited a siloxane starting material and particles, wherein the siloxane starting material has a siloxane polymer, a siloxane oligomer and/or silane monomers, and wherein the particles have an average particle size of less than 400 nm. After deposition, heat and/or electromagnetic energy is applied to the siloxane particle layer so as to cure the layer and form a dielectric film on the substrate. The formed film is optically transmissive to visible light and transmits at least 80% of the visible light incident thereon, and is electrically insulating and has a sheet resistance of 1000 Ω/sq or more.

40 Claims, 10 Drawing Sheets

(51) Int. Cl.
C09J 183/06 (2006.01)
G06F 3/041 (2006.01)

(56) References Cited

U.S. PATENT DOCUMENTS

| | | | |
|---|---|---|---|
| 8,828,642 B2* | 9/2014 | Kamogawa | G02B 1/04 430/270.1 |
| 2007/0298248 A1* | 12/2007 | Hongo | C08J 7/047 428/333 |
| 2010/0174024 A1* | 7/2010 | Du | C08K 3/22 524/428 |
| 2010/0280163 A1* | 11/2010 | Hasegawa | C08K 5/14 524/430 |
| 2011/0051064 A1 | 3/2011 | Matsumori et al. | |
| 2015/0329679 A1* | 11/2015 | Yoshida | B82Y 30/00 525/475 |

FOREIGN PATENT DOCUMENTS

| | | |
|---|---|---|
| EP | 1387367 A1 | 2/2004 |
| EP | 2075277 A2 | 7/2009 |
| EP | 2236543 A1 | 10/2010 |
| EP | 2485091 A1 | 8/2012 |
| JP | 2002156639 A | 5/2002 |
| JP | 2003255403 A | 9/2003 |
| JP | 2008189917 A | 8/2008 |
| JP | 2008202033 A | 9/2008 |
| JP | 2010192378 A | 9/2010 |
| KR | 20120119020 A | 10/2012 |
| WO | WO2010110049 A1 | 9/2010 |
| WO | WO 2011/040248 * | 7/2011 |

\* cited by examiner

DIELECTRIC SILOXANE PARTICLE FILMS, AND DEVICES HAVING THE SAME

TECHNICAL FIELD

The present invention relates to dielectric films. In particular, the present invention concerns siloxane films containing particles, methods of producing such films, displays comprising the films and methods of producing such displays.

BACKGROUND ART

LEDs and LCDs appear in a wide variety of products, from lighting fixtures (LEDs) to displays (both LEDs and LCDs), such as displays in smartphones, tablets, laptops, computer monitors, televisions, displays and touch screens in consumer products and homes or in businesses, etc.

Both LED and LCD devices can incorporate dielectric layers. Such dielectric layers can appear as passivation layers, encapsulants, thick film or thin film dielectrics, etc within the LED or LCD devices. One area in which they appear is between two electrically conductive layers in the touch screen portion of a display.

Dielectric film materials are disclosed in US 20110051064, U.S. Pat. No. 5,645,901 and KR 20120119020. There is still a need for improved materials having properties of stability and of extended shelf life.

SUMMARY OF INVENTION

It is an aim of the present invention to eliminate at least a part of the problems relating to the known materials.

It is an aim of the present invention to provide a dielectric film comprising a siloxane polymer and particles within the siloxane polymer.

It is another aim of the present invention to provide a method of producing a siloxane polymer film.

It is a third aim of the present invention to provide a display.

It is a fourth aim of the present invention to provide a method of making a display.

It is a fifth aim of the present invention to provide a composition comprising a siloxane polymer having a [—Si—O—Si—O]n repeating backbone and particles.

It is a sixth aim of the present invention to provide a touch panel.

According to the present invention, a dielectric film is provided, comprising—formed on a supporting substrate—a dielectric layer comprising a siloxane polymer and particles within the siloxane polymer and having an average particle size of less than 1 micron; wherein the dielectric layer is optically transmissive to visible light and transmits at least 75% of the light incident thereon; and
wherein the dielectric layer is electrically insulating. and has a sheet resistance of 1000 Ω/sq or more.

Typically, the siloxane polymer has a molecular weight of from 300 to 10,000 g/mol; and
wherein the composition has a viscosity of from 1000 to 75,000 mPa-sec at 5 rpm viscometer and at 25° C.; and is substantially free of —OH groups therein.

More specifically, the present invention is characterized by what is stated in the independent claims.

Considerable advantages are achieved. Thus, an optically transparent, electrically insulating, nanoparticle-siloxane composite dielectric is disclosed, along with devices incorporating the same. Non-electrically conductive particles, which can be spherical, branched, flakes or wires, are deposited within or are surrounded with a siloxane composite. In all cases, high optical transmission is achieved with index of refraction between 1.2 and 2.0.

The coating can be also patterned according to various patterning processes disclosed herein. The formed transparent electrically insulating dielectric preferably comprises at least one type of electrically insulating particles such as high aspect ratio particles, e.g. flakes, and at least one type of siloxane polymer. If desired, additional low aspect ratio particles, e.g. nanoparticles, can be included to adjust the film's refractive index, thermal conductivity, electrical conductivity, mechanical properties, thermal stability or chemical resistance.

As disclosed herein the transparent insulating dielectric can be part of a touch sensor, display, OLED device, vertical emitter InGaN LED, IME shield, or part of any other device that can benefit from electrically insulating and transparent films.

Example embodiments will be more clearly understood from the following detailed description taken in conjunction with the accompanying drawings, in which:

DESCRIPTION OF EMBODIMENTS

Figure 1:
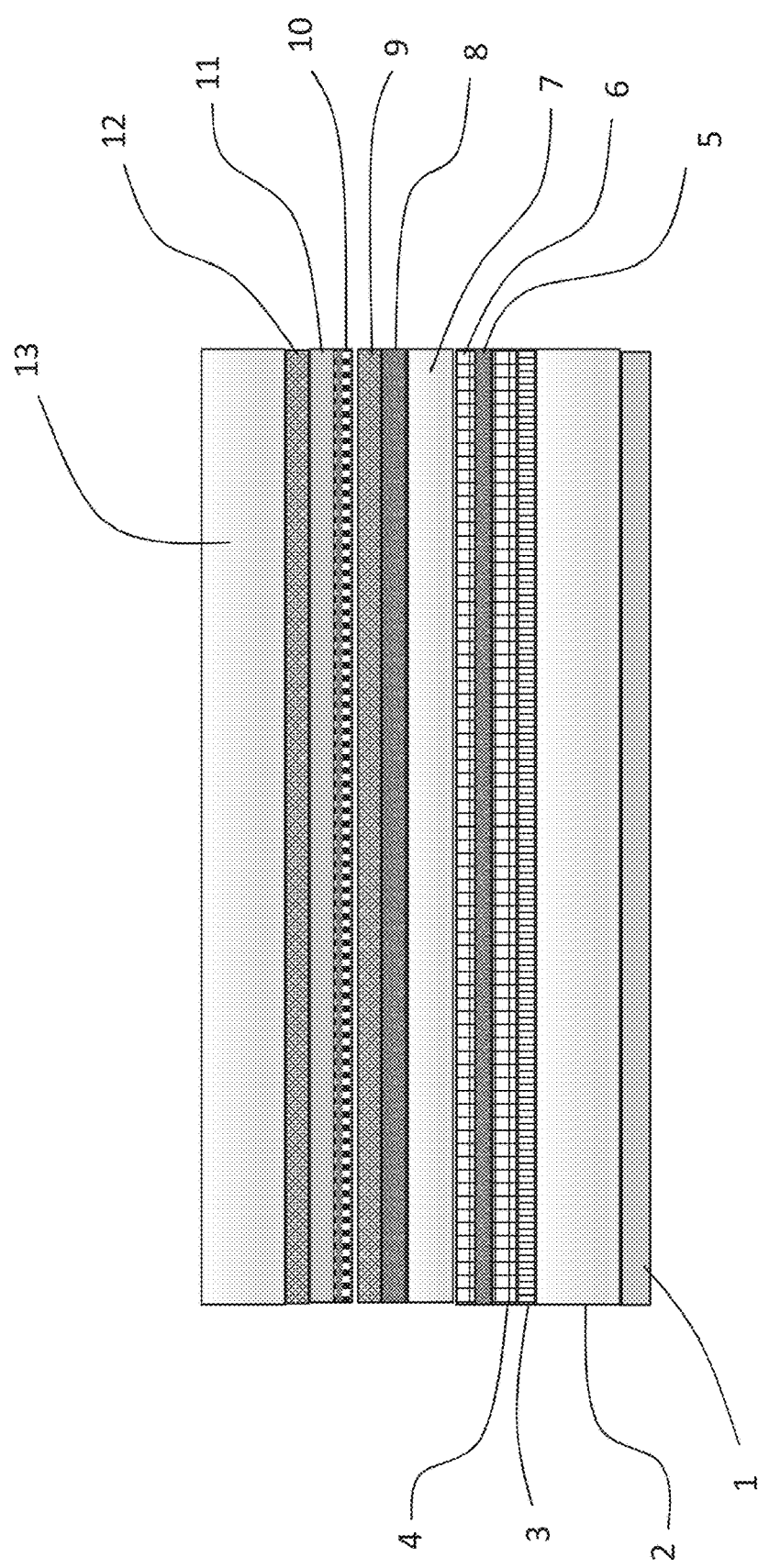
FIG. 1 is a cross sectional view of an on-cell touch capacitive panel display device.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will also be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It is noted that, as used herein, the singular forms of "a", "an" and "the" include plural referents unless the context clearly dictates otherwise. It will be further understood that the term "comprises" and/or "comprising", when used in this specification, specify the presence of stated features, steps, operations, elements, and/or components, but do not preclude the addition of one or more other features, steps, operations, elements, components, and/or groups thereof.

The lower case letters used in the below formulas for monomers and polymers stand in particular for integers.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As disclosed herein, a novel siloxane particle composition that is optically transmissive in the visible spectrum and that is electrically insulating can be used in semiconductor devices and microelectronic and optoelectronic devices, such as displays (e.g. LED displays such as OLED/AMOLED or LCD displays) which utilize electrically insulating layers throughout. In particular, though not limited thereto, are touchscreen displays, such as resistive or capacitive touchscreens for smartphones, tablets, laptops and notebooks, computer monitors, as well as touchscreens on digital cameras, camcorders, portable game devices, personal multimedia players, e-book readers, printers, automotive displays, GPS/PND navigation devices, etc as well as touchscreens in retail, commercial and industrial environments.

However non-touchscreen versions of such products may also benefit from the siloxane particle insulating and light transmissive materials as disclosed herein.

As discussed above, both LED and LCD devices can incorporate dielectric layers. Such dielectric layers can appear as passivation layers, encapsulants, thick film or thin film dielectrics, etc within the LED or LCD devices. One area in which they appear is between two electrically conductive layers in the touch screen portion of a display. The example below is with regard to a touchscreen display, however the dielectric materials as disclosed herein can be used wherever dielectric materials area needed, particularly in optoelectronic devices where transparent insulating materials are desired.

In a resistive type touch screen, a flexible clear top substrate (e.g. a plastic film such as polyester) is disposed spaced apart from a more rigid bottom substrate (e.g. a glass substrate) with an air gap therebetween. When a user's finger touches the flexible top substrate, it deflects so as to make contact with the bottom substrate. The voltage at the point of contact can be measured and the location of the point of contact calculated. In a capacitive type touch panel, on the display (e.g. an array of LCD or LED pixels) is connected an additional substrate or substrates, which can be any suitable material such as glass, polyester, acrylic, etc. The substrate(s) have a matrix of electrically conducting lines with a dielectric layer therebetween. A top cover lens is bonded to enclose the whole assembly. When a user's finger touches the cover substrate, it increases the measured capacitance of the electrodes nearest to the point of touch, where the change in capacitance can be measured and used to calculate the location of the touch. Surface capacitive or projected capacitive examples can both incorporate the electrically conductive material as disclosed herein. Various substrates are part of the display, such as a substrate on which are formed the color filters, a substrate on which are formed the TFT array, cover substrates etc—and are bonded together with adhesives that are preferably insulating and highly transmissive to visible light. Whether a layer is a dielectric between two conducting layers acting as a capacitor, a passivation or encapsulation layer, an adhesive, etc., the siloxane particle transparent and insulating film as disclosed herein can be useful.

FIG. 1 is a cross sectional view of an on-cell touchscreen capacitive type display. As can be seen in this figure, a substrate 2, which can be a suitable transparent substrate such as glass or polymer, has a polarizer layer 1 thereon. Formed on the glass is a thin film transistor array 3, and an array of liquid crystal cells 4. Thereon is disposed VCOM layer 5 (common electrode) and color filters 6 on glass substrate 7. The touch sensitive portion of the device is formed of a patterned electrically conductive layer 8, insulating layer 9 and patterned electrically conductive layer 10. In patterned layer 10, the pattern lines come out of the page, whereas in layer 8, the patterns run orthogonally to the lines in layer 10 (i.e. horizontally in a left-right direction on the page). Positioned between the two electrically conductive layers 8 and 10 is dielectric layer 9. A second polarizer is shown as layer 11, and a cover glass 13 is bonded to the rest of the structure via adhesive layer 12.

In FIG. 1, both the dielectric layer 9 and adhesive layer 12 can be, with the same or different formulation, a siloxane particle transparent and insulating layer as disclosed herein below. Though the dielectric layer can be particle free, preferably it comprises particles, such as ceramic particles that have an average particle size of less than 1 um. Depending upon the selected siloxane material and particle material and size (as will be discussed below) the transparency and refractive index can be tuned. It is also possible that electrically conductive portions in the device, such as patterned layers 8 and 10, are also made of a siloxane particle material, as will be discussed in more depth hereinbelow. Utilizing the same or similar material for multiple layers, both electrically insulating and conducting, in the device helps with matching CTE and refractive indices and can improve the overall optical and lifetime qualities of the device.

Figure 2:
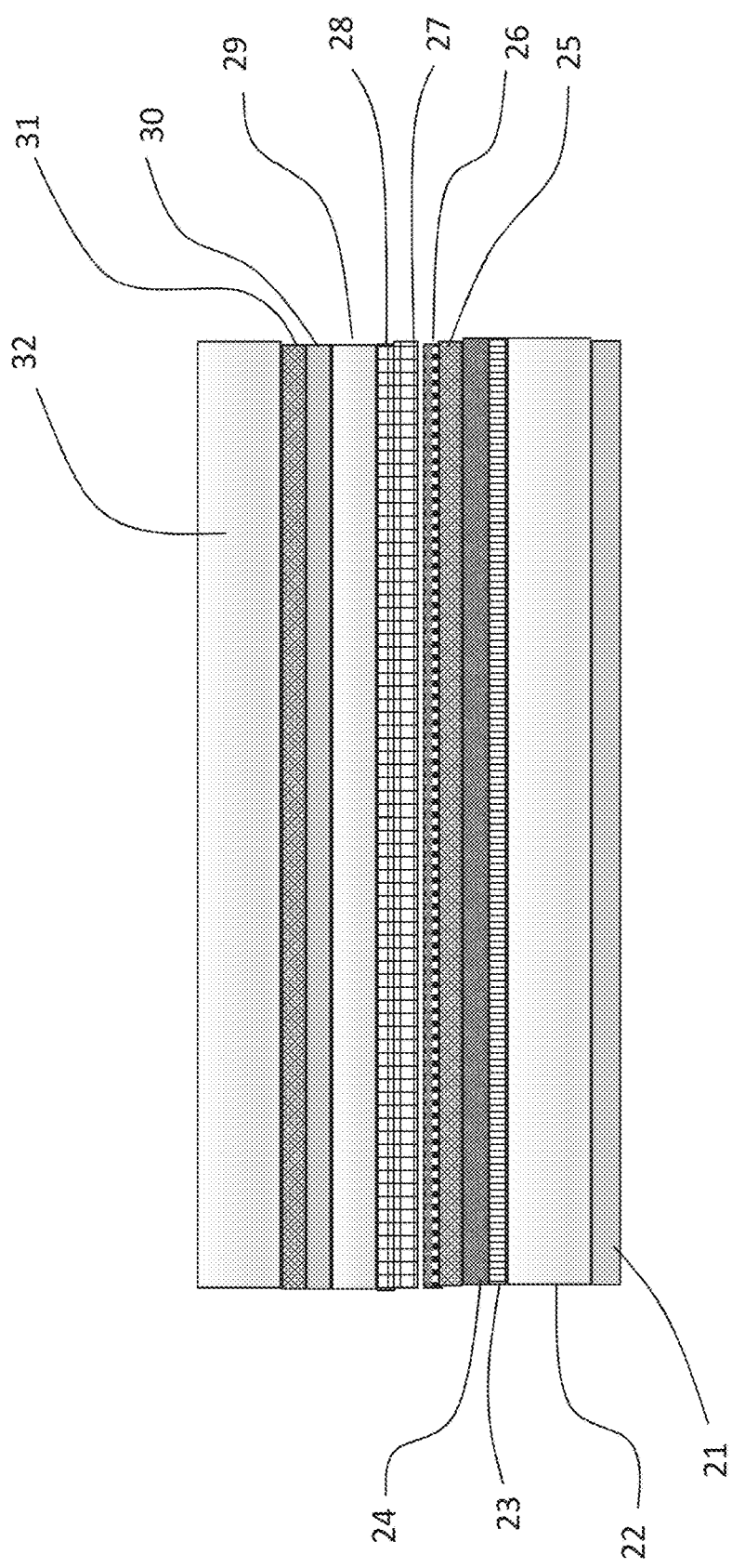
FIG. 2 is a cross sectional view of an in-cell capacitive touch panel display device.

FIG. 2 is a cross sectional view of an in-cell touchscreen capacitive type display. As can be seen in FIG. 2, on glass substrate 22 is provided a polarizing layer 21 and a thin film transistor array 23. Thereon is provided the capacitive touchscreen portion of the display, where an electrically conductive layer 24, and an electrically conductive layer 26 have therebetween an insulating layer 25. In this example, the patterned electrical lines in layer 26 are coming out of the page, whereas the patterned lines of layer 24 run horizontally, left to right on the page. Also illustrated is a layer of LCD cells 27, and color filters 28 on transparent substrate 29. Additionally provided are a polarizing layer 30 and an adhesive layer 31 for bonding an additional transparent substrate 32 on top. The transparent substrates in FIGS. 1 and 2 can independently made of glass or polymer (polyester/polyethylene terephthalate, acrylic/polymethyl methacrylate, etc) or other suitable light transmissive substrate. As with FIG. 1, the adhesive layer 31 and insulating layer 25 can be made of a siloxane particle material that is insulating and light transmissive. Also, the electrically conductive layers 24 and 26 can also be made of a siloxane particle material, but one that is electrically conductive but also preferably highly transmissive to visible light, as will be discussed further hereinbelow.

Figure 3:
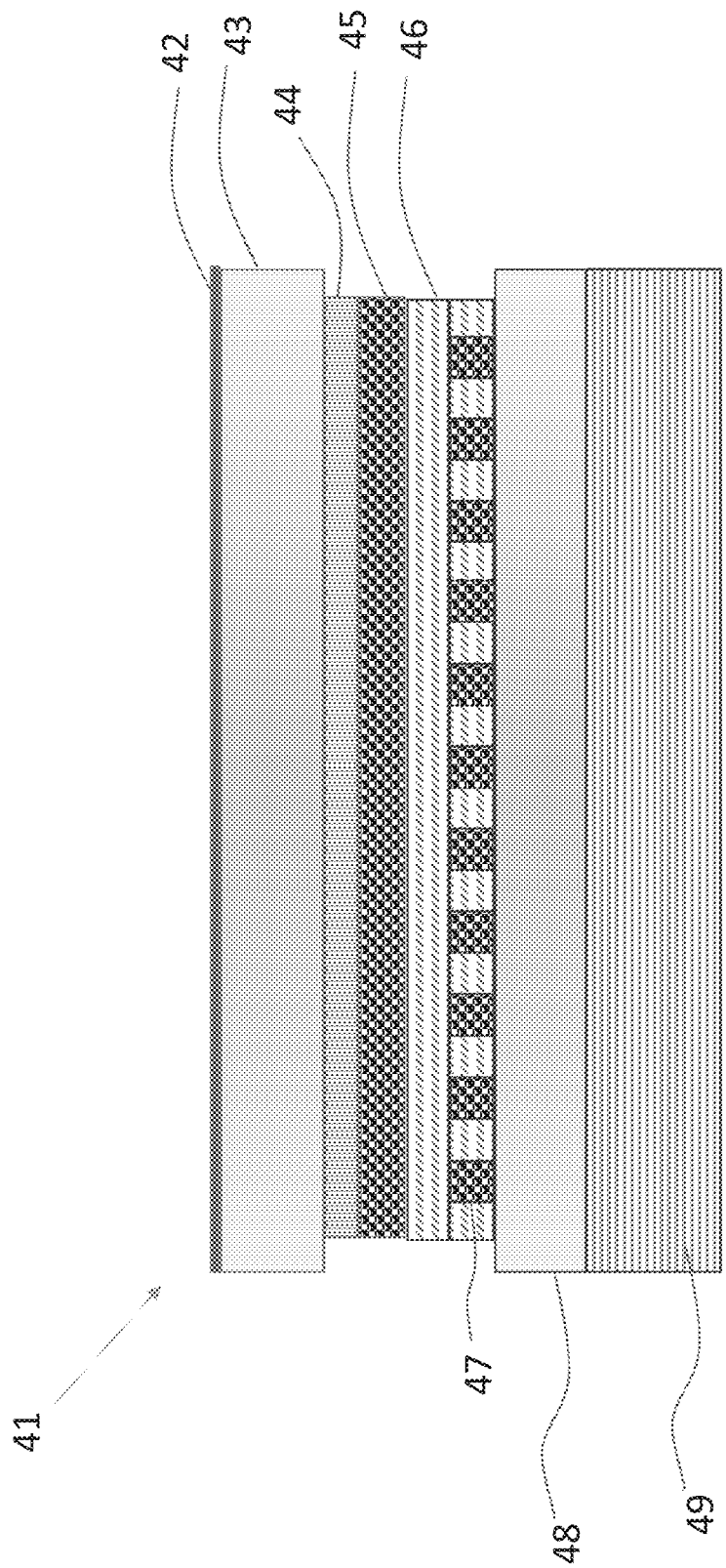
FIG. 3 is a simplified view of a touch panel display device.

As can be seen in FIG. 3, a cross section of an exemplary capacitive touch display 1 is illustrated in amplified form. As shown in FIG. 3, 9 is a simplified view of the liquid crystal display layers (liquid crystal material, color filters, supporting substrate(s) etc.). Disposed thereon is a light transmissive substrate 8, which can be any suitable material such as glass, polyester, acrylic etc. On substrate 8 are electrically conductive patterns 7, which are lines extending out of the plane of FIG. 3 and are optionally made of electrically conductive siloxane particle material as mentioned above. These conductive bands extend across the length of the display. Formed on the conductive bands is a capacitor layer—an insulating layer 6, which can be deposited so as to fill in the spaces between the conductive bands 7 and form an insulating layer above. This insulating layer is preferably the siloxane particle material as mentioned above, preferably with particles selected to provide an electrically insulating layer, such as ceramic particles (e.g. oxide or nitride particles) and optical transparency in the visible spectrum. Both the electrically conducting bands 7 and dielectric layer 6 should be transmissive to visible light, preferably each transmitting at least 70% of visible light incident thereon, though more preferably at least 80%, and more preferably at least 90%, at least 92.5%, or at least 95%.

As can further be seen in FIG. 3, an additional layer of patterned electrically conductive bands 5 are provided. In this case, the conductive bands are formed as strips extending perpendicularly (or otherwise not parallel) to the bands 7 on the opposite side of dielectric layer 5. Conductive lines 5 can be the driving lines of the display and conductive lines 7 can be the sensing lines. Also shown is an upper light transmissive substrate 3, which can be glass, polyester, acrylic or other suitable material that is transmissive to light in the visible spectrum. Substrate 3 is adhered via adhesive 4, that should also be transmissive to visible light, and which can be made with the siloxane material as disclosed herein, with or without the particles therein. Utilizing the same or similar material for multiple layers in the device helps with matching CTE and refractive indices and can improve the overall optical and lifetime qualities of the device.

Areas between conducting bands 5 (and/or conducting bands 7) can be siloxane material with particles as disclosed herein, that is electrically insulating and optically transmissive. Note that area 9 may be display pixels other than LCD pixels (plasma, LED etc), and that the conductive areas may be incorporated within the liquid crystal display 9, such as with in-cell touch displays as mentioned above. On-cell, in-cell and out-cell touch displays can all use the electrically insulating siloxane particle material as disclosed herein, as can non-touchscreen displays that utilize dielectric films therein.

Figure 4:
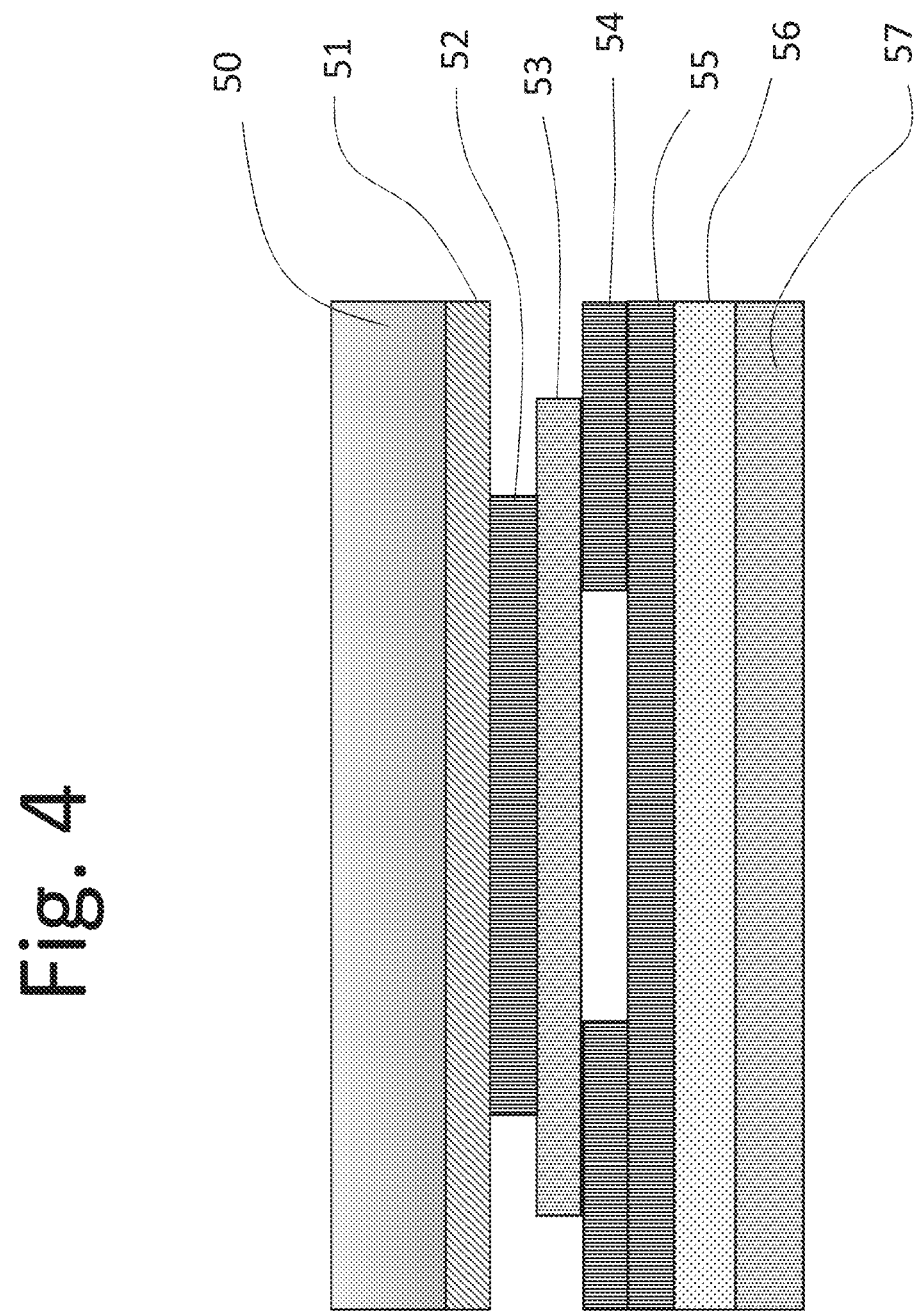
FIG. 4 is a cross sectional view of an on-glass capacitive touch panel display device.

An on-glass touch screen display is illustrated in cross section in FIG. 4. As shown in FIG. 4, on a light transmissive substrate 50, is disposed a transparent electrically conducting layer 51, an electrically conductive jumper 52, and a dielectric layer 53 (e.g. a UV cured insulating layer). Also illustrated are metal traces 54, an electrically conductive pattern 55, passivation layer 56 and an additional dielectric over coat 57. Layer 52 can be deposited at high temperature, with layer 55 deposited at a low temperature. The electrically conductive layers can be provided as the siloxane polymer as disclosed herein, but with metal particles so as to make an electrically conductive layer after heat curing, whereas the dielectric layers can be provided as the siloxane material as disclosed herein, with ceramic particles such as oxide or nitride particles, and cured by either heat or UV treatment.

Though no solvent is necessary for the application of the siloxane composition, if very thin layers are desired, it may be desirable to add an organic solvent, non polar or polar (protic or aprotic), so as to provide the siloxane material as a low viscosity liquid in order to minimize the deposited layer's thickness. Lowering the molecular weight of the siloxane polymer that is part of the composition, or using monomers (e.g. the first, second and/or third compounds) in place of the siloxane polymer in the composition, can lower the viscosity and aid in minimizing the film thickness (and thus increase light transmissivity) if desired. Surfactants and UV sensitive additives that enable the siloxane composition to react upon exposure to UV light can be added. Selecting the functional reactive group as acrylate can aid in polymerization under UV light.

Figure 5C:
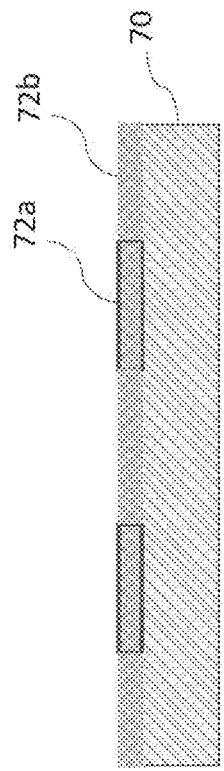
FIGS. 5a to 5d illustrate one method for patterning an insulating siloxane particle film.
Figure 5D:
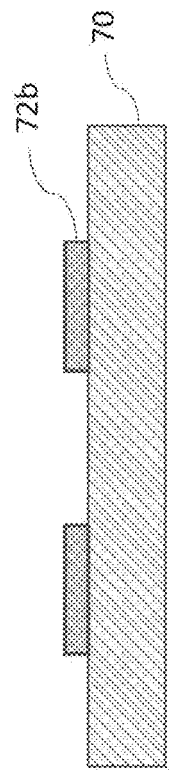
Figure 5A:
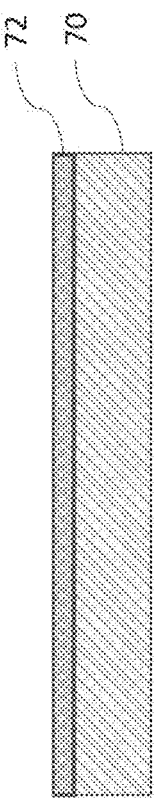

As can be seen in FIGS. 5a to 5d, a UV patternable deposition method is illustrated. In FIG. 5a, a substrate 70 can be provided that is any suitable substrate such as glass, quartz, sapphire, polymer, semiconductor, ceramic, metal, etc. On substrate 70 is deposited a siloxane composition as disclosed herein and preferably comprising particles as disclosed hereinabove. The siloxane particle composition can be deposited as a fluid, e.g. a liquid or gel, preferably dispensed by a process such as syringe deposition or screen printing. Other deposition methods could be used, such as spin-on, dip, ink-jet, curtain, drip, roller, gravure, reverse offset, extrusion coating, slit coating, spray coating, flexographic, etc. Also, substrate 70 may or may not have been singulated from a wafer, but could instead be a whole wafer, or a portion cut from large sheets, such as large glass sheets used for display panels, solar cells, or the like. Depositing on large sheets in a roll to roll process is possible. Furthermore, substrate 70 could be adhered to the support substrate at the wafer level, with both the substrates singulated together into individual die. For displays or photovoltaic cells, preferred is a deposition method that can be incorporated into a roll to roll process.

Figure 5B:
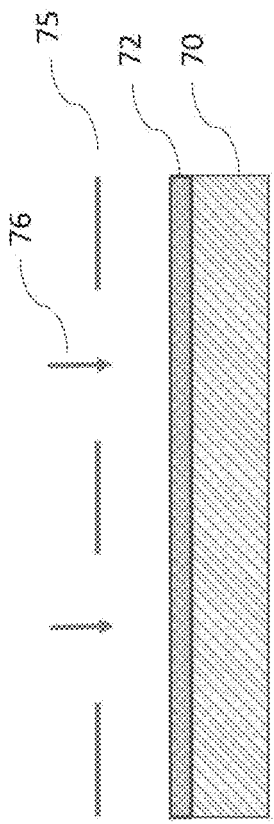
Figure 6A:
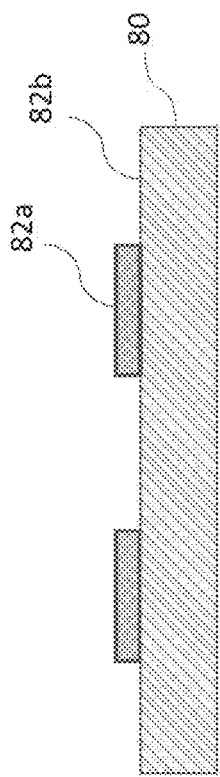
FIGS. 6a to 6d illustrate an alternative method for patterning an insulating siloxane particle film.
Figure 6B:
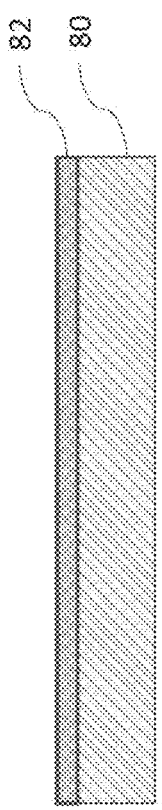
Figure 6C:
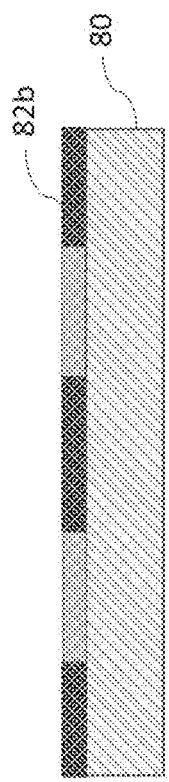
Figure 6D:
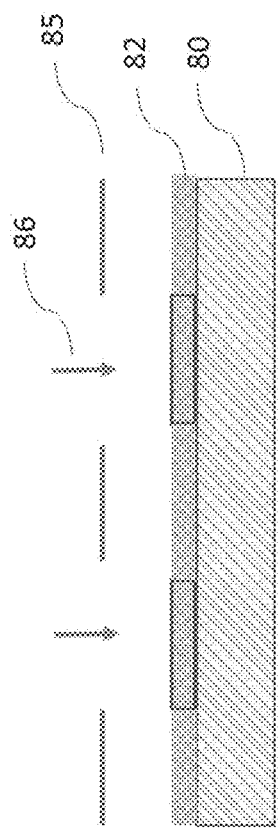

As can be seen in FIG. 5b, a mask 75 is disposed adjacent the siloxane layer and UV light is provided to the siloxane layer via apertures in the mask. The UV light cures and hardens the siloxane layer in the exposed areas 72a, whereas the unexposed areas 72b remain soft, as illustrated in FIG. 5c. As can be seen in FIG. 5d, a developer is used to remove unexposed areas 72b leaving pattern 72a in place. Various baking or drying steps may be used, such as a soft bake after initial application of the siloxane material 72, and a hard bake after removal of the unexposed areas 72b.

As an alternative to using a mask to directly pattern the siloxane material as discussed above, it is also possible to pattern the siloxane material via a photoresist layer deposited thereon. In such a process, after deposition and soft bake of the siloxane layer, a photoresist layer is deposited thereon. The photoresist can be any suitable photoresist material, including a positive photoresist where the part of the photoresist that is exposed to light becomes soluble to the photoresist developer and where the part of the photoresist that is not exposed to light remains insoluble to the developer. Or, a negative photoresist can be used where the part of the photoresist that is exposed to light becomes insoluble to the developer and the unexposed part of the photoresist is soluble to the developer. Any suitable photoresist, such as SU-8, PMMA, DNQ/Novolac, PMGI, etc can be used. Regardless of the type of photoresist used, when the pattern is formed within the photoresist material, the pattern acts as a mask for UV exposing selectively the underlying siloxane material, so as to ultimately form a patterned siloxane layer.

As mentioned hereinabove, the siloxane particle layer is preferably electrically insulating, optically transmissive, and patternable. However, it is also possible to provide a siloxane particle layer for heat dissipation, in view of the general problem of heat buildup in consumer and other devices. The siloxane layer could therefore be provided as a thermally conductive layer, such as one that is optically transmissive, patterned or not, and electrically insulating or not. The particles that are of an electrically insulating material (various nitrides, oxides etc as mentioned herein) can be selected for their thermally conductive but electrically insulating properties. Of course, if the substrate is not optically transmissive, or the position within the device does not require high optical transmissivity in the visible spectrum, the thermally conductive and electrically insulating layer may be light reflecting or light absorbing, depending upon the particles (type, quantity and size) selected.

Also, the dielectric siloxane layer can be provided as a solid film, not patterned, but simply exposed to UV light for curing as a continuous film. The film can be crosslinked by UV only without any heat being applied, or it can be curable with a combination of UV and heat, such as where the heat is less than 120 C or even less than 100 C for heat sensitive devices. In some cases it may be desirable that UV induced radicals or photo acid generators move laterally in the dielectric film to non-exposed areas to cause crosslinking and curing in non-exposed regions such as under non UV transparent cover glass frames.

The siloxane composition may comprise coupling agents, curing agents, antioxidants, adhesion promoters and the like, as disclosed herein. In particular, the siloxane material comprises reactive groups on the Si—O backbone that are reactive upon the application of incident UV light. The developer can be any suitable developer, such as TMAH, KOH, NaOH etc. It is also possible to pattern the siloxane material with laser patterning, instead of UV light.

As can be seen in FIG. 6, an alternative process is illustrated for providing a pattern of electrically insulating material. As shown in FIG. 6a, on a substrate 80 is deposited an electrically conducting layer 82. The electrically conducting layer can be any suitable conducting film, though preferred is the siloxane material as disclosed herein, with particles therein. If particles are present, they should be ones that provide electrically conducting properties—e.g. metal particles. As shown in FIG. 6b, layer 82 is patterned such as with UV light. The patterning could also be with laser patterning or other suitable process such as hot embossing. Once layer 82 is exposed to the UV light 86 via mask 85, as shown in FIG. 6c, the unexposed portions are removed so as to leave empty areas or grooves 82b and electrically conducting portions 82a on substrate 80 (FIG. 6d). Thereafter, the electrically insulating material as disclosed herein is provided to the empty areas, so as to provide an electrically insulating pattern on substrate 80.

For FIG. 6, the electrically insulating material deposited in the formed grooves or lines is preferably the siloxane particle material as disclosed herein, and where the particles are preferably ceramic particles, such as silica, quartz, alumina, aluminum nitride, aluminum nitride coated with silica, barium sulfate, alumina trihydrate, boron nitride, or oxides of titanium, tantalum, aluminum, zirconium, hafnium or selenium. The siloxane particle material can be used for both the electrically conducting and electrically insulating portions, in one example both siloxanes have a similar, or preferably the same organic substitutent (e.g. the R2 group of the first compound $SiR^1_aR^2_{4-a}$ where a is from 1 to 3, $R^1$ is a reactive group, and $R^2$ is an alkyl group or an aryl group, as mentioned hereinabove, or that the same monomer $SiR^1_aR^2_{4-a}$ is used for making the siloxane polymer for both the electrically conducting and electrically insulating materials. This helps with film stability and closer CTE values for the conducting and insulating portions. Also, in examples where electrically insulating material is disposed in a different layer than the electrically conducting material, such as for the capacitor portion between patterned electrically conductive layers in a capacitive touch screen display, the same $R^2$ group and/or same starting monomer can be used.

An alternative method of forming the patterned electrically conductive layer, it is possible to first deposit the particles onto a substrate separately from the siloxane material. In such a case, the particles can be deposited in an organic solvent or aqueous solvent solution or other carrier to form a nanowire 'matrix' on the substrate. After drying or other suitable method for removing the solvent, a particle 'film' remains. Thereon is deposited the siloxane material as disclosed herein. The siloxane material can be deposited with a solvent, with further drying and polymerization (e.g. application of heat and/or UV light) of the siloxane, to form a combined finally cured siloxane nanowire layer. Or the siloxane can be deposited without any added solvent at a desired molecular weight that provides the desired viscosity, followed by application of heat or UV light to harden and cure the siloxane material. It is also possible to provide silicon containing monomers at this stage (e.g. the first compound, second compound, or other optional components e.g. optional third compound, coupling agents etc.) followed by the application of heat and/or UV light to the layer comprising the particles and polymerized siloxane.

The electrically insulating layers as disclosed herein can be provided as multiple layers within a device, such as a first patterned electrically insulating siloxane particle layer, and a second electrically insulating layer (patterned or not). It is also possible to have areas between the electrically insulating portions within the same layer that are of the same or similar siloxane material but with particles that provide electrical conductivity. Also, an intervening electrically conductive layer could be provided between the plurality of electrically insulating siloxane layers. With both the electrically conducting and electrically insulating portions made from the same or similar siloxane material as disclosed herein, problems of CTE mismatch can be lowered.

More particularly with regard to the siloxane particle composition referred to hereinabove, a composition is made where a siloxane polymer is provided. Preferably the polymer has a silicon oxide backbone, with aryl (or alkyl) substituents as well as functional cross-linking substituents. A filler material is mixed with the siloxane polymer. The filler material is preferably particulate material comprising particles having an average particle size of 100 microns or less, preferably 10 microns or less. A catalyst is added, the catalyst being reactive with the functional cross-linking groups in the siloxane polymer when heat or UV light (or other activation method) is provided to the composition.

A monomeric (or oligomeric) coupling agent(s) are included in the composition, preferably having functional cross-linking groups that are likewise reactive upon the application of heat or light as in the siloxane polymer. Additional materials such as stabilizers, antioxidants, dispersants, adhesion promoters, plasticizers, softeners, and other potential components, depending upon the final use of the composition, can also be added. Though a solvent could be added, in a preferred embodiment the composition is solvent-free and is a viscous fluid without solvent which is stored and shipped as such.

As noted above, the composition being made as disclosed herein, comprises a siloxane polymer. To make the siloxane polymer, a first compound is provided having a chemical formula $SiR^1_a R^2_{4-a}$ where a is from 1 to 3, $R^1$ is a reactive group, and $R^2$ is an alkyl group or an aryl group. Also provided is a second compound that has the chemical formula $SiR^3_b R^4_c R^5_{4-(b+c)}$ where $R^3$ is a cross-linking functional group, $R^4$ is a reactive group, and $R^5$ is an alkyl or aryl group, and where b=1 to 2, and c=1 to (4−b). An optional third compound is provided along with the first and second compounds, to be polymerized therewith. The third compound may have the chemical formula $SiR^9_f R^{10}_g$ where $R^9$ is a reactive group and f=1 to 4, and where $R^{10}$ is an alkyl or aryl group and g=4−f. The first, second and third compounds may be provided in any sequence, and oligomeric partially polymerized versions of any of these compounds may be provided in place of the above-mentioned monomers.

The first, second and third compounds, and any compounds recited hereinbelow, if such compounds have more than one of a single type of "R" group such as a plurality of aryl or alkyl groups, or a plurality of reactive groups, or a plurality of cross-linking functional groups, etc., the multiple R groups are independently selected so as to be the same or different at each occurrence. For example, if the first compound is $SiR^1_2 R^2_2$, the multiple $R^1$ groups are independently selected so as to be the same or different from each other. Likewise the multiple $R^2$ groups are independently selected so as to be the same or different from each other. The same is for any other compounds mentioned herein, unless explicitly stated otherwise.

A catalyst is also provided. The catalyst may be a base catalyst, or other catalyst as mentioned below. The catalyst provided should be capable of polymerizing the first and second compounds together. As mentioned above, the order of the addition of the compounds and catalyst may be in any desired order. The various components provided together are polymerized to create a siloxane polymeric material having a desired molecular weight and viscosity. After the polymerization, particles, such as microparticles, nanoparticles or other desired particles are added, along with other optional components such as coupling agents, catalyst, stabilizers, adhesion promoters, and the like. The combination of the components of the composition can be performed in any desired order.

More particularly, in one example, a siloxane polymer is made by polymerizing first and second compounds, where the first compound has the chemical formula $SiR^1_a R^2_{4-a}$ where a is from 1 to 3, $R^1$ is a reactive group, and $R^2$ is an alkyl group or an aryl group, and the second compound has the chemical formula $SiR^3_b R^4_c R^5_{4-(b+c)}$ where $R^3$ is a cross-linking functional group, $R^4$ is a reactive group, and $R^5$ is an alkyl or aryl group, and where b=1 to 2, and c=1 to (4−b).

The first compound may have from 1 to 3 alkyl or aryl groups ($R^2$) bound to the silicon in the compound. A combination of different alkyl groups, a combination of different aryl groups, or a combination of both alkyl and aryl groups is possible. If an alkyl group, the alkyl contains preferably 1 to 18, more preferably 1 to 14 and particularly preferred 1 to 12 carbon atoms. Shorter alkyl groups, such as from 1 to 6 carbons (e.g. from 2 to 6 carbon atoms) are envisioned. The alkyl group can be branched at the alpha or beta position with one or more, preferably two, C1 to C6 alkyl groups. In particular, the alkyl group is a lower alkyl containing 1 to 6 carbon atoms, which optionally bears 1 to 3 substituents selected from methyl and halogen. Methyl, ethyl, n-propyl, i-propyl, n-butyl, i-butyl and t-butyl, are particularly preferred. A cyclic alkyl group is also possible like cyclohexyl, adamantyl, norbornene or norbornyl.

If $R^2$ is an aryl group, the aryl group can be phenyl, which optionally bears 1 to 5 substituents selected from halogen, alkyl or alkenyl on the ring, or naphthyl, which optionally bear 1 to 11 substituents selected from halogen alkyl or alkenyl on the ring structure, the substituents being optionally fluorinated (including per-fluorinated or partially fluorinated). If the aryl group is a polyaromatic group, the polyaromatic group can be for example anthracene, naphthalene, phenanthere, tetracene which optionally can bear 1-8 substituents or can be also optionally 'spaced' from the silicon atom by alkyl, alkenyl, alkynyl or aryl groups containing 1-12 carbons. A single ring structure such as phenyl may also be spaced from the silicon atom in this way.

The siloxane polymer is made by performing a polymerization reaction, preferably a base catalyzed polymerization reaction between the first and second compounds. Optional additional compounds, as set forth below, can be included as part of the polymerization reaction.

The first compound can have any suitable reactive group $R^1$, such as a hydroxyl, halogen, alkoxy, carboxyl, amine or acyloxy group. If, for example, the reactive group in the first compound is an —OH group, more particular examples of the first compound can include silanediols such as diphenylsilanediol, dimethylsilanediol, di-isopropylsilanediol, di-n-propylsilanediol, di-n-butylsilanediol, di-t-butylsilanediol, di-isobutylsilanediol, phenylmethylsilanediol and dicyclohexylsilanediol among others.

The second compound can have any suitable reactive group $R^4$, such as a hydroxyl, halogen, alkoxy, carboxyl, amine or acyloxy group, which can be the same or different from the reactive group in the first compound. Group $R^5$, if present at all in the second compound, is independently an alkyl or aryl groups such as for group $R^2$ in the first compound. The alkyl or aryl group $R^5$ can be the same or different from the group $R^2$ in the first compound.

The cross-linking reactive group $R^3$ of the second compound can be any functional group that can be cross-linked by acid, base, radical or thermal catalyzed reactions. These functional groups can be for example any epoxide, oxetane, acrylate, alkenyl or alkynyl group.

If an epoxide group, it can be a cyclic ether with three ring atoms that can be cross-linked using acid, base and thermal catalyzed reactions. Examples of these epoxide containing cross-linking groups are glycidoxypropyl and (3,4-Epoxycyclohexyl)ethyl) groups to mention few If an oxetane group, it can be a cyclic ether with four ring atoms that can be cross-linked using acid, base and thermal catalyzed reactions. Examples of such oxetane containing silanes include 3-(3-ethyl-3-oxetanylmethoxy)propyltriethoxysilane, 3-(3-Methyl-3-oxetanylmethoxy)propyltriethoxysilane, 3-(3-ethyl-3-oxetanylmethoxy)propyltrimethoxysilane or 3-(3-Methyl-3-oxetanylmethoxy) propyltrimethoxysilane, to mention a few.

If an alkenyl group, such a group may have preferably 2 to 18, more preferably 2 to 14 and particularly preferred 2 to 12 carbon atoms. The ethylenic, i.e. two carbon atoms bonded with double bond, group is preferably located at the position 2 or higher, related to the Si atom in the molecule. Branched alkenyl is preferably branched at the alpha or beta position with one and more, preferably two, C1 to C6 alkyl, alkenyl or alkynyl groups, optionally fluorinated or per-fluorinated alkyl, alkenyl or alkynyl groups.

If an alkynyl group, it may have preferably 2 to 18, more preferably 2 to 14 and particularly preferred 2 to 12 carbon atoms. The ethylinic group, i.e. two carbon atoms bonded with triple bond, group is preferably located at the position 2 or higher, related to the Si or M atom in the molecule. Branched alkynyl is preferably branched at the alpha or beta position with one and more, preferably two, C1 to C6 alkyl, alkenyl or alkynyl groups, optionally per-fluorinated alkyl, alkenyl or alkynyl groups.

If a thiol group, it may be any organosulfur compound containing carbon-bonded sulfhydryl group. Examples of thiol containing silanes are 3-mercaptopropyltrimethoxysilane and 3-mercaptopropyltriethoxysilane.

The reactive group in the second compound can be an alkoxy group. The alkyl residue of the alkoxy groups can be linear or branched. Preferably, the alkoxy groups are comprised of lower alkoxy groups having 1 to 6 carbon atoms, such as methoxy, ethoxy, propoxy and t-butoxy groups. A particular examples of the second compound is an silane, such as 2-(3,4-Epoxycyclohexyl)ethyltrimethoxysilane, 2-(3,4-epoxycyclohexyl)ethyltriethoxysilane, 3-(Trimethoxysilyl)propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane, 3-acryloxypropyltrimethoxysilane, among others.

A third compound may be provided along with the first and second compounds, to be polymerized therewith. The third compound may have the chemical formula $SiR^9_f R^{10}_g$ where $R^9$ is a reactive group and f=1 to 4, and where $R^{10}$ is an alkyl or aryl group and g=4−f. One such example is tetramethoxysilane. Other examples include phenylmethyldimethoxysilane, trimethylmethoxysilane, dimethyldimethoxysilanesilane, vinyltrimethoxysilane, allyltrimethoxysilane, methyltrimethoxysilane, methyltriethoxysilane, methyl tripropoxysilane, propylethyltrimethoxysilane, ethyltriethoxysilane, vinyltrimethoxysilane, vinyltriethoxysilane, among others.

Though the polymerization of the first and second compounds can be performed using an acid catalyst, a base catalyst is preferred. The base catalyst used in a base catalyzed polymerization between the first and second compounds can be any suitable basic compound. Examples of these basic compounds are any amines like triethylamine and any barium hydroxide like barium hydroxide, barium hydroxide monohydrate, barium hydroxide octahydrate, among others. Other basic catalysts include magnesium oxide, calcium oxide, barium oxide, ammonia, ammonium perchlorate, sodium hydroxide, potassium hydroxide, imidazone or n-butyl amine. In one particular example the base catalyst is $Ba(OH)_2$. The base catalyst can be provided, relative to the first and second compounds together, at a weight percent of less than 0.5%, or at lower amounts such as at a weight percent of less than 0.1%.

Polymerization can be carried out in melt phase or in liquid medium. The temperature is in the range of about 20 to 200° C., typically about 25 to 160° C., in particular about 40 to 120° C. Generally polymerization is carried out at ambient pressure and the maximum temperature is set by the boiling point of any solvent used. Polymerization can be carried out at refluxing conditions. Other pressures and temperatures are also possible. The molar ratio of the first compound to the second compound can be 95:5 to 5:95, in particular 90:10 to 10:90, preferably 80:20 to 20:80. In a preferred example, the molar ratio of the first compound to the second compound (or second plus other compounds that take part in the polymerization reaction—see below) is at least 40:60, or even 45:55 or higher.

In one example, the first compound has —OH groups as the reactive groups and the second compound has alkoxy groups as the reactive groups. Preferably, the total number of —OH groups for the amount of the first compound added is not more than the total number of reactive groups, e.g. alkoxy groups in the second compound, and preferably less than the total number of reactive groups in the second compound (or in the second compound plus any other compounds added with alkoxy groups, e.g. an added tetramethoxysilane or other third compound involved in the polymerization reaction, ad mentioned herein). With the alkoxy groups outnumbering the hydroxyl groups, all or substantially all of the —OH groups will react and be removed from the siloxane, such as methanol if the alkoxysilane is a methoxysilane, ethanol if the alkoxysilane is ethoxysilane, etc. Though the number of —OH groups in the first compound and the number of the reactive groups in the second compound (preferably other than —OH groups) can be substantially the same, it is preferably that the total number of reactive groups in the second compound outnumber the —OH groups in the first compound by 10% or more, preferably by 25% or more. In some embodiments the number of second compound reactive groups outnumber the first compound —OH groups by 40% or more, or even 60% or more, 75% or more, or as high as 100% or more. The methanol, ethanol or other byproduct of the polymerization reaction depending upon the compounds selected, is removed after polymerization, preferably evaporated out in a drying chamber.

The obtained siloxane polymers have any desired (weight average) molecular weight, such as from 500 to 100,000 g/mol. The molecular weight can be in the lower end of this range (e.g., from 500 to 10,000 g/mol, or more preferably 500 to 8,000 g/mol) or the organosiloxane material can have a molecular weight in the upper end of this range (such as from 10,000 to 100,000 g/mol or more preferably from 15,000 to 50,000 g/mol). It may be desirable to mix a polymer organosiloxane material having a lower molecular weight with an organosiloxane material having a higher molecular weight.

The obtained siloxane polymer may then be combined with additional components depending upon the final desired use of the polymer. Preferably, the siloxane polymer is combined with a filler to form a composition, such as a particulate filler having particles with an average particle size of less than 100 microns, preferably less than 50 microns, including less than 20 microns. Additional components may be part of the composition, such as catalysts or curing agents, one or more coupling agents, dispersants, antioxidants, stabilizers, adhesion promoters, and/or other desired components depending upon the final desired use of the siloxane material. In one example, a reducing agent that can reduce an oxidized surface to its metallic form, is included. A reducing agent can remove oxidation from particles if they are metallic particles with surface oxidation, and/or remove oxidation from e.g. metallic bonding pads or other metallic or electrically conductive areas that have oxidized, so as to improve the electrical connection between the siloxane particle material and the surface on which it is deposited or adhered. Reducing or stabilization agents can include ethylene glycol, beta-D-glucose, poly ethylene oxide, glycerol, 1,2-propylene glycol, N,N dimethyl formamide, poly-sodium acrylate (PSA), betacyclodextrin with polyacrylic acid, dihydroxy benzene, poly vinyl alcohol, 1,2-propylene glycol, hydrazine, hydrazine sulfate, Sodium borohydride, ascorbic acid, hydroquinone family, gallic acid, pyrogallol, glyoxal, acetaldehyde, glutaraldehyde, aliphatic dialdehyde family, paraformaldehyde, tin powder, zinc powder, formic acid. An additive such as a stabilization agent, e.g. an antioxidant such as Irganox (as mentioned hereinbelow) or a diazine derivative can also be added.

Cross-linking silicon or non-silicon based resins and oligomers can be used to enhance cross linking between siloxane polymers. The functionality of added cross-linking oligomer or resin is chosen by functionality of siloxane polymer. If for example epoxy based alkoxysilanes were used during polymerization of siloxane polymer, then epoxy functional oligomer or resin can be used. The epoxy oligomer or resin can be any di, tri, tetra, or higher functionality epoxy oligomer or resin. Examples of these epoxy oligomers or resins can be 1,1,3,3-tetramethyldisiloxane-1,3-bis2-(3,4-epoxycyclohexyl)ethyl, 1,1,3,3-tetramethyldisiloxane-1,3-bisglycidoxypropyl, Bis(3,4-epoxycyclohexylmethyl) adipate, 3,4-Epoxycyclohexylmethyl 3,4-epoxycyclohexanecarboxylate, 1,4-Cyclohexanedimethanol diglycidyl ether, Bisphenol A diglycidyl ether, Diglycidyl 1,2-cyclohexanedicarboxylate, to mention a few.

The curing agent added to the final formulation is any compound that can initiate and/or accelerate the curing process of functional groups in siloxane polymer. These curing agents can be either heat and/or UV activated. The cross-linking groups in the siloxane polymer, as mentioned above, are preferably epoxide, oxetane, acrylate, alkenyl or alkynyl groups. The curing agent is selected based on the cross-linking group in the siloxane polymer.

In one embodiment, the curing agent for epoxy and oxetane curing groups can be selected from nitrogen-containing curing agents, such as primary and/or secondary amines which show blocked or decreased activity. The definition "primary or secondary amines which show blocked or decreased reactivity" shall mean those amines which due to a chemical or physical blocking are incapable or only have very low capability to react with the resin components, but may regenerate their reactivity after liberation of the amine, e.g. by melting it at increased temperature, by removing sheath or coatings, by the action of pressure or of supersonic waves or of other energy types, the curing reaction of the resin components starts.

Examples of heat-activatable curing agent include complexes of at least one organoborane or borane with at least one amine. The amine may be of any type that complexes the organoborane and/or borane and that can be decomplexed to free the organoborane or borane when desired. The amine may comprise a variety of structures, for example, any primary or secondary amine or polyamines containing primary and/or secondary amines. The organoborane can be selected from alkyl boranes. An example of these heat-activatable, particular preferred borane compounds is boron trifluoride. Suitable amine/(organo)borane complexes are available from commercial sources such as King Industries, Air products, and ATO-Tech.

Other heat activated curing agents for epoxy groups are thermal acid generators which can release strong acids at elevated temperature to catalyze cross-linking reactions of epoxy. These thermal acid generators can be for example any onium salts like sulfonium and iodonium salts having complex anion of the type $BF_4^-$, $PF_6^-$, $SbF_6^-$, $CF_3SO_3^-$, and $(C_6F_5)_4B^-$. Commercial examples of these thermal acid generators are K-PURE CXC-1612 and K-PURE CXC-1614 manufactured by King Industries.

Additionally, with respect to epoxy and/or oxetane containing polymers, curing agent, co-curing agents, catalysts, initiators or other additives designed to participate in or promote curing of the adhesive formulation like for example, anhydrides, amines, imidazoles, thiols, carboxylic acids, phenols, dicyandiamide, urea, hydrazine, hydrazide, amino-formaldehyde resins, melamine-formaldehyde resins, quaternary ammonium salts, quaternary phosphonium salts, tri-aryl sulfonium salts, di-aryl iodonium salts, diazonium salts, and the like, can be used.

For acrylate, alkenyl and alkynyl cross linking groups curing agent can be either thermal or UV activated. Examples of thermal activated are peroxides and azo compounds. Peroxide is a compound containing unstable oxygen-oxygen single bond which easily split into reactive radicals via hemolytic cleavage. Azo compounds have R—N═N—R functional group which can decompose to nitrogen gas and two organic radicals. In both of these cases, the radicals can catalyze the polymerization of acrylate, alkenyl and alkynyl bonds. Examples of peroxide and azo compounds are di-tert-butyl peroxide, 2,2-Bis(tert-butylperoxy)butane, tert-Butyl peracetate, 2,5-Di(tert-butylperoxy)-2,5-dimethyl-3-hexyne, Dicumyl peroxide, Benzoyl peroxide, Di-tert-amyl peroxide, tert-Butyl peroxybenzoate, 4,4'-Azobis(4-cyanopentanoic acid), 2,2'-Azobis(2-amidinopropane) dihydrochloride, diphenyldiazene, Diethyl azodicarboxylate and 1,1'-Azobis(cyclohexanecarbonitrile) to mention a few Photoinitiators are compounds that decompose to free radicals when exposed to light and therefore can promote polymerization of acrylate, alkenyl and alkynyl compounds. Commercial examples of these photoinitiators are Irgacure 149, Irgacure 184, Irgacure 369, Irgacure 500, Irgacure 651, Irgacure 784, Irgacure 819, Irgacure 907, Irgacure 1700, Irgacure 1800, Irgacure 1850, Irgacure 2959, Irgacure 1173, Irgacure 4265 manufactured by BASF.

One method to incorporate curing agent to the system is to attach a curing agent or a functional group that can act as curing agent, to a silane monomer. Therefore the curing agent will accelerate curing of the siloxane polymer. Examples of these kind of curing agents attached to a silane monomer are to γ-Imidazolylpropyltriethoxysilane, γ-Imidazolylpropyltrimethoxysilane, 3-mercaptopropyltrimethoxysilane, 3-mercaptopropyltriethoxysilane, 3-(triethoxysilyl)propylsuccinicanhydride, 3-(trimethoxysilyl)propylsuccinicanhydride, 3-aminopropyltrimethoxysilane and 3-aminopropyltriethoxysilane to mention a few.

An adhesion promoter can be part of the composition and can be any suitable compound that can enhance adhesion between cured product and surface where product has been applied. Most commonly used adhesion promoters are functional silanes where alkoxysilanes and one to three functional groups. Examples of adhesion promoter used in die attach products can be octyltriethoxysilane, mercaptopropyltriethoxysilane, cyanopropyltrimethoxysilane, 2-(3,4-Epoxycyclohexyl)ethyltrimethoxysilane, 2-(3,4-epoxycyclohexyl)ethyltriethoxysilane, 3-(Trimethoxysilyl)propylmethacrylate, 3-(Trimethoxysilyl)propylacrylate, (3-glycidyloxypropyl)trimethoxysilane, or 3-glycidoxypropyltriethoxysilane, 3-methacryloxypropyltrimethoxysilane and 3-acryloxypropyltrimethoxysilane.

The polymerized siloxane formed will have a [Si—O—Si—O]n repeating backbone, with organic functional groups thereon depending on the silicon containing starting materials. However it is also possible to achieve a [Si—O—Si—C]n or even a [Si—O—Me-O]n (where Me is a metal) backbone.

To obtain [Si—O—Si—C] backbone, a chemical with formula $R^2{}_aR^1{}_aSiR^{11}SiR^1{}_bR^2{}_{3-b}$ wherein
a is from 1 to 3,
b is from 1 to 3,
$R^1$ is a reactive group like explained above,
$R^2$ is an alkyl, alkenyl, alkynyl, alcohol, carboxylic acid, dicarboxylic acid, aryl, polyaryl, polycyclic alkyl, hetero cyclic aliphatic, hetero cyclic aromatic group and
$R^{11}$ is independently an alkyl group or aryl group,
or an oligomer thereof having a molecular weight of less than 1000 g/mol,
can be polymerized together with the first, second, and third compounds or any combination of these, as mentioned above.

Examples of these compound are 1,2-bis(dimethylhydroxylsilyl)ethane, 1,2-bis(trimethoxylsilyl)ethane, 1,2-Bis(dimethoxymethylsilyl)ethane, 1,2-Bis(methoxydimethylsilyl) ethane, 1,2-bis(triethoxylsilyl)ethane, 1,3-bis(dimethylhydroxylsilyl)propane, 1,3-bis(trimethoxylsilyl)propane, 1,3-Bis(dimethoxymethylsilyl)propane, 1,3-Bis(methoxydimethylsilyl) propane, 1,3-bis(triethoxylsilyl)propane, 1,4-bis(dimethylhydroxylsilyl)butane, 1,4-bis(trimethoxylsilyl)butane, 1,4-Bis(dimethoxymethylsilyl)butane, 1,4-Bis(methoxydimethylsilyl) butane, 1,4-bis(triethoxylsilyl)butane, 1,5-bis(dimethylhydroxylsilyl)pentane, 1,5-bis(trimethoxylsilyl)pentane, 1,5-Bis(dimethoxymethylsilyl)pentane, 1,5-bis(methoxydimethylsilyl) pentane, 1,5-bis(triethoxylsilyl) pentane, 1,6-bis(dimethylhydroxylsilyl)hexane, 1,6-bis(trimethoxylsilyl)hexane, 1,6-Bis(dimethoxymethylsilyl) hexane, 1,6-Bis(methoxydimethylsilyl) hexane, 1,6-bis(triethoxylsilyl)hexane 1,4-bis(trimethoxylsilyl)benzene, bis(trimethoxylsilyl)naphthalene, bis(trimethoxylsilyl)anthrazene, bis(trimethoxylsilyl)phenanthere, bis(trimethoxylsilyl)norbornene, 1,4-Bis(dimethylhydroxysilyl)benzene, 1,4-bis(methoxydimethylsilyl) benzene and 1,4-bis(triethoxysilyl)benzene to mention few.

In one embodiment to obtain [Si—O—Si—C] backbone, a compound with formula $R^5{}_{3-(c+d)}R^4{}_dR^3{}_cSiR^{11}SiR^3{}_eR^4{}_fR^5{}_{3-(e+f)}$ wherein
$R^3$ is a cross-linking functional group,
$R^4$ is a reactive group, and
$R^5$ is an alkyl, alkenyl, alkynyl, alcohol, carboxylic acid, dicarboxylic acid, aryl, polyaryl, polycyclic alkyl, hetero cyclic aliphatic, hetero cyclic aromatic group,
$R^{12}$ is independently an alkyl group or aryl group, and where c=1 to 2, d=1 to (3−c), e=1 to 2, and f=1 to (3−e),
or an oligomer thereof having a molecular weight of less than 1000 g/mol,
is polymerized together with the first, second, third compounds as mentioned herein, or any combinations of these.

Examples of these compounds are 1,2-bis(ethenyldimethoxysilyl)ethane, 1,2-bis(ethynyldimethoxysilyl)ethane, 1,2-bis(ethynyldimethoxy)ethane, 1,2-bis(3-glycidoxypropyldimethoxysilyl)ethane, 1,2-bis[2-(3,4-Epoxycyclohexyl)ethyldimethoxysilyl]ethane, 1,2-bis(propylmethacrylatedimethoxysilyl)ethane, 1,4-bis(ethenyldimethoxysilyl)benzene, 1,4-bis(ethynyldimethoxysilyl)benzene, 1,4-bis(ethynyldimethoxysilyl)benzene, 1,4-bis(3-glycidoxypropyldimethoxysilyl)benzene, 1,4-bis[2-(3,4-epoxycyclohexyl)ethyldimethoxysilyl]benzene, 1,4-bis(propyl methacrylate-dimethoxysilyl)benzene, to mention few.

In one embodiment a siloxane monomer with molecular formula $R^1{}_aR^2{}_bR^3{}_{3-(a+b)}Si{-}O{-}SiR^2{}_2{-}O{-}SiR^1{}_aR^2{}_bR^3{}_{3-(a+b)}$ where
$R^1$ is reactive group like explained above,
$R^2$ is alkyl or aryl like explained above,
$R^3$ is cross linking functional group like explained above and a=0 to 3, b=0 to 3,
is polymerized with previously mentioned silanes or added as an additive to the final formulation.

Examples of these compounds are 1,1,5,5-tetramethoxy-1,5-dimethyl-3,3-diphenyltrisiloxane, 1,1,5,5-tetramethoxy-1,3,3,5-tetraphenyltrisiloxane, 1,1,5,5-tetraethoxy-3,3-diphenyltrisiloxane, 1,1,5,5-tetramethoxy-1,5-divinyl-3,3-diphenyltrisiloxane, 1,1,5,5-tetramethoxy-1,5-dimethyl-3,3-diisopropyltrisiloxane, 1,1,1,5,5,5-hexamethoxy-3,3-diphenyltrisiloxane, 1,5-dimethyl-1,5-diethoxy-3,3-diphenyltrisiloxane, 1,5-bis(mercaptopropyl)-1,1,5,5-tetramethoxy-3,3-diphenyltrisiloxane, 1,5-divinyl-1,1,5,5-tetramethoxy-3-phenyl-3-methyltrisiloxane, 1,5-divinyl-1,1,5,5-tetramethoxy-3-cyclohexyl-3-methyltrisiloxane, 1,1,7,7-tetramethoxy-1,7-divinyl-3,3,5,5-tetramethyltetrasiloxane, 1,1,5,5-tetramethoxy-3,3-dimethyltrisiloxane, 1,1,7,7-tetraethoxy-3,3,5,5-tetramethyltetrasiloxane, 1,1,5,5-tetraethoxy-3,3-dimethyltrisiloxane, 1,1,5,5-tetramethoxy-1,5-[2-(3,4-epoxycyclohexyl)ethyl]-3,3-diphenyltrisiloxane, 1,1,5,5- tetramethoxy-1,5-(3-glycidoxypropyl)-3,3-diphenyltrisiloxane, 1,5-dimethyl-1,5-dimethoxy-1,5-[2-(3,4-epoxycyclohexyl)ethyl]-3,3-diphenyltrisiloxane, 1,5-dimethyl-1,5-dimethoxy-1,5-(3-glycidoxypropyl)-3,3-diphenyltrisiloxane to mention few examples.

An additive added to the composition (after polymerization of the siloxane material as noted above) can be a silane compound with formula of $$R^1_a R^2_b SiR^3_{4-(a+b)}$$

where
$R^1$ is reactive group like hydroxyl, alkoxy or acetyloxy,
$R^2$ is alkyl or aryl group,
$R^3$ is crosslinking compound like epoxy, oxetane, alkenyl, acrylate or alkynyl group,
a=0 to 1 and b=0 to 1.

Examples of such additives are tri-(3-glycidoxypropyl)phenylsilane, tri-[2-(3,4-epoxycyclohexyl)ethyl]phenylsilane, tri-(3-methacryloxypropyl)phenylsilane, tri-(3-acryloxypropyl)phenylsilane, tetra-(3-glycidoxypropyl)silane, tetra-[2-(3,4-epoxycyclohexyl)ethyl]silane, tetra-(3-methacryloxypropyl)silane, tetra-(3-acryloxypropyl)silane, tri-(3-glycidoxypropyl)p-tolylsilane, tri-[2-(3,4-epoxycyclohexyl)ethyl]p-tolylsilane, tri-(3-methacryloxypropyl)p-tolylsilane, tri-(3-acryloxypropyl)p-tolylsilane, tri-(3-glycidoxypropyl)hydroxylsilane, tri-[2-(3,4-epoxycyclohexyl)ethyl]hydroxylsilane, tri-(3-methacryloxypropyl)hydroxylsilane, tri-(3-acryloxypropyl)hydroxylsilane.

The additives can be also any organic or silicone polymers that may react or may not react with the main polymer matrix therefore acting as plasticizer, softener, or matrix modifier like silicone. The additive can be also an inorganic polycondensate such as SiOx, TiOx, AlOx, TaOx, HfOx, ZrOx, SnOx, polysilazane.

For a dielectric layer, patterned or not, the particles added to the siloxane composition can be formed from an electrically nonconductive material, such as silica, quartz, alumina, aluminum nitride, aluminum nitride coated with silica, barium sulfate, alumina trihydrate, boron nitride, etc. The fillers can be the form of particles or flakes, and can be micro-sized or nano-sized. The filler may comprise ceramic compound particles that are nitrides, oxynitrides, carbides, and oxycarbides of metals or semimetals are possible. In particular, the filler can be particles that are ceramic particles that are an oxide of silicon, zinc, aluminum, yttrium, ytterbium, tungsten, titanium silicon, titanium, antimony, samarium, nickel, nickel cobalt, molybdenum, magnesium, manganese, lanthanide, iron, indium tin, copper, cobalt aluminum, chromium, cesium or calcium. The particles could instead be nitride particles, such as aluminum nitride, tantalum nitride, boron nitride, titanium nitride, copper nitride, molybdenum nitride, tungsten nitride, iron nitride, silicon nitride, indium nitride, gallium nitride or carbon nitride.

The particle filler may be also be formed of a conductive material (such as for an electrically conductive or other layer within the same device) such as carbon black, graphite, graphene, gold, silver, copper, platinum, palladium, nickel, aluminum, silver plated copper, silver plated aluminum, bismuth, tin, bismuth-tin alloy, silver plated fiber, nickel plate copper, silver and nickel plated copper, gold plated copper, gold and nickel plated copper, or it may be gold, silver-gold, silver, nickel, tin, platinum, titanium plated polymer such as polyacrylate, polystyrene or silicone but not limited to these. The filler can be also a semiconductor material such as silicon, n or p type doped silicon, GaN, InGaN, GaAs, InP, SiC but not limited to these. Furthermore, the filler can be quantum dot or a surface plasmonic particle or phosphor particle. Other semiconductor particles or quantum dots, such as Ge, GaP, InAs, CdSe, ZnO, ZnSe, TiO2, ZnS, CdS, CdTe, etc. are also possible.

Alternatively, the filler for e.g. a conductive layer can be particles that are any suitable metal or semi-metal particles such as those selected from gold, silver, copper, platinum, palladium, indium, iron, nickel, aluminum, carbon, cobalt, strontium, zinc, molybdenum, titanium, tungsten, silver plated copper, silver plated aluminum, bismuth, tin, bismuth-tin alloy, silver plated fiber or alloys or combinations of these. Metal particles that are transition metal particles (whether early transition metals or late transition metals) are envisioned, as are semi metals and metalloids. Semi-metal or metalloid particles such as arsenic, antimony, tellurium, germanium, silicon, and bismuth are envisioned.

Also possible are particles that comprise carbon and are selected from carbon black, graphite, graphene, diamond, silicon carbonitride, titanium carbonitride, carbon nanobuds and carbon nanotubes. The particles of the filler can be carbide particles, such as iron carbide, silicon carbide, cobalt carbide, tungsten carbide, boron carbide, zirconium carbide, chromium carbide, titanium carbide, or molybdenum carbide.

Particles of any suitable size can be used, depending upon the final application. In many cases small particles having an average particle size of less than 100 microns, and preferably less than 50 or even 20 microns are used. However, for obtaining higher optical transmissivity, sub-micron particles, such as those less than 1 micron, or e.g. from 1 to 500 nm, such as less than 200 nm, such as from 1 to 100 nm, or even less than 10 nm, are also envisioned. In other examples, particles are provided that have an average particle size of from 5 to 50 nm, or from 15 to 75 nm, less than 100 nm, or from 50 to 500 nm. Desirable are nanoparticles having an average particle size of less than 50 nm, e.g. less than 25 nm. In general for improved optical transmissivity, it can be desirable to provide particles with an average particle size less than the wavelength of electromagnetic radiation passing therethrough. For visible light devices (displays, lamps etc) with visible light being within 400 to 700 nm, it is preferably that the particles have an average particle size of less than 700 nm and more preferably less than 400 nm.

Particles that are not elongated, e.g. substantial spherical or square, or flakes with a flattened disc shaped appearance (with smooth edges or rough edges) are possible, as are elongated whiskers, cylinders, wires and other elongated particles, such as those having an aspect ratio of 5:1 or more, or 10:1 or more. Very elongated particles, such as nanowires and nanotubes having a very high aspect ratio are also possible, though for optical transmissivity purposes, a maximum average dimension of less than 400 nm is preferred. High aspect ratios for nanowires or nanotubes can be at 25:1 or more, 50:1 or more, or even 100:1 or more. The average particle size for nanowires or nanotubes is in reference to the smallest dimension (width or diameter) as the length can be quite long, even up to centimeters long. As used herein, the term "average particle size" refers to the D50 value of the cumulative volume distribution curve at which 50% by volume of the particles have a diameter less than that value.

To enhance the coupling with filler and siloxane polymer, a coupling agent can be used. This coupling agent will increase the adhesion between filler and polymer and therefore can increase thermal and/or electrical conductivity of the final product. The coupling agent can be any silane monomer with a formula of $$R^{13}_h R^{14}_i SiR^{15}_j$$

where
R$^3$ is a reactive group like halogen, hydroxyl, alkoxy, acetyl or acetyloxy,
R$^{14}$ is alkyl or aryl group and
R$^{15}$ is a functional group including like epoxy, anhydride, cyano, oxetane, amine, thiol, allyl, alkenyl or alkynyl,
h=0 to 4, 1=0 to 4, j=0 to 4 and h+i+j=4.

The coupling agent can be either mixed directly with filler, siloxane polymer, curing agent, and additives when final product is prepared or the filler particles can be treated by the coupling agent before they are mixed with particles.

The particles can be provided to the siloxane material with or without surface treatment. If surface treated first, the surface can be coated with an organic material such as carboxylic acid, PVP or PVA, and could be an amine, thiol, silane or combination thereof.

If the particles are treated with a coupling agent before using them in the final formulation, different methods like deposition from alcohol solution, deposition from aqueous solution, bulk deposition onto filler and anhydrous liquid phase deposition can be used. In the deposition from alcohol solution, alcohol/water solution is prepared and the solution pH is adjusted to slightly acidic (pH 4.5-5.5). Silane is added to this solution and mixed for few minutes to allow partly hydrolyzing. Then filler particles are added and the solution is mixed from to RT to refluxing temperature for different time periods. After mixing, the particles are filtered, rinsed with ethanol and dried in an oven to obtain surface treated particles by the coupling agent. Deposition from aqueous solution is similar compared to deposition from alcohol solution but instead of alcohol, pure water is used as a solvent. pH is again adjusted by acid if non amine functionalized is used. After mixing particles with water/silane mixture, the particles are filtered, rinsed and dried.

Bulk deposition method is a method where silane coupling agent is mixed with solvent without any water or pH adjustment. The filler particles are coated with the silane alcohol solution using different methods like spray coating and then dried in an oven.

In the anhydrous liquid phase deposition, silane are mixed with organic solvent like toluene, tetrahydrofuran or hydrocarbon and filler particles are refluxed in this solution and the extra solvent is removed by vacuum or filtering. The particles can be also dried afterwards in an oven but it is not sometimes need due to direct reaction between particles and filler under refluxing conditions.

Examples of such silane coupling agents are bis (2-hydroxyethyl)-3-aminopropyltriethoxysilane, Allyltrimethoxysilane, N-(2-Aminoethyl)-3-aminopropylmethyldimethoxysilane, N-(2-Aminoethyl)-3-aminopropyltrimethoxysilane, 3-Aminopropylmethyldiethoxysilane. 3-Aminopropyltriethoxysilane, 3-Aminopropyltrimethoxysilane, (N-Trimethoxysilylpropyl)polyethyleneimine, Trimethoxysilylpropyldiethylenetriamine, Phenyltriethoxysilane, Phenyltrimethoxysilane, 3-Chloropropyltrimethoxysilane, 1-Trimethoxysilyl-2(p,m-chloromethyl)phenylethane, 2-(3, 4-Epoxycyclohexyl)ethyltrimethoxysilane, 3-Glycidoxypropyltrimethoxysilane, Isocyanatepropyltriethoxysilane, Bis[3-(triethoxysilyl)propyl]tetrasulfide, 3-Mercaptopropylmethyldimethoxysilane, 3-Mercaptopropyltrimethoxysilane, 3-Methacryloxypropyltrimethoxysilane, 2-(Diphenylphosphino)ethyltriethoxysilane, 1,3-Divinyltetramethyldisilazane, Hexamethyldisilazane, 3-(N-Styrylmethyl-2-aminoethylamino)propyltrimethoxysilane, N-(Triethoxysilylpropyl)urea, 1,3-Divinyltetramethyldisilazane, Vinyltriethoxysilane and Vinyltrimethoxysilane to mention a few.

Depending on the type of particles added, the siloxane-particle cured final product can be a layer or film that is thermally conductive, such as having a thermal conductivity, after final heat or UV curing, of greater than 0.5 watts per meter kelvin (W/(m·K)). Higher thermal conductivity materials are possible, depending upon the type of particles selected. Metal particles in the siloxane composition can result in a cured final film having a thermal conductivity greater than 2.0 W/(m·K), such as greater than 4.0 W/(m·K), or even greater than 10.0 W/(m·K). However in other applications, particles may be selected to result, if desired, in a material having low thermal conductivity, such as for the transparent dielectric layers as disclosed herein.

For a dielectric layer having a high resistivity, a sheet resistance of e.g. greater than Also, if desired the final cured product can have high electrical resistivity, such as greater than $1\times10^3$ Ω/square, preferably greater than $1\times10^3$ Ω/square, such as greater than $1\times10^5$ Ω/square, or even higher at e.g. greater than $1\times10^5$ Ω/square. As mentioned herein, the insulating layer can also be used in conjunction with siloxane particle electrically conductive layers in which case such layers would preferably have a sheet resistance of 200 Ω/square or less, preferably 100 Ω/square, e.g. 50 Ω/square.

In some cases, in LED or LCD devices such as displays or where the insulating siloxane composition will be applied in a device that requires optical characteristics, though it may be desirable in some cases for the final cured siloxane to have optically absorbing or optically reflecting properties, it is more likely that the material would desirably be highly transmissive to light in the visible spectrum (or in the spectrum in which the final device is operated). As an example of a transparent material, the final cured layer having a thickness of from 1 to 50 microns will transmit at least 85% of the visible light incident perpendicularly thereto, or preferably transmit at least 90%, more preferably at least 92.5% and most preferably at least 95% As an example of a reflective layer, the final cured layer can reflect at least 85% of the light incident thereon, preferably reflect at least 95% of the light incident thereon at an angle of 90 degrees.

The material of the present invention may also contain a stabilizer and/or an antioxidant. These compounds are added to protect the material from degradation caused by reaction with oxygen induced by such things as heat, light, or residual catalyst from the raw materials.

Among the applicable stabilizers or antioxidants included herein are high molecular weight hindered phenols and multifunctional phenols such as sulfur and phosphorous-containing phenol. Hindered phenols are well known to those skilled in the art and may be characterized as phenolic compounds which also contain sterically bulky radicals in close proximity to the phenolic hydroxyl group thereof. In particular, tertiary butyl groups generally are substituted onto the benzene ring in at least one of the ortho positions relative to the phenolic hydroxyl group. The presence of these sterically bulky substituted radicals in the vicinity of the hydroxyl group serves to retard its stretching frequency, and correspondingly, its reactivity; this hindrance thus providing the phenolic compound with its stabilizing properties. Representative hindered phenols include; 1,3,5-trimethyl-2, 4,6-tris-(3,5-di-tert-butyl-4-hydroxybenzyl)-benzene; pentaerythrityl tetrakis-3(3,5-di-tert-butyl-4-hydroxyphenyl)-propionate; n-octadecyl-3(3,5-di-tert-butyl-4-hydroxyphenyl)-propionate; 4,4'-methylenebis(2,6-tert-butyl-phenol); 4,4'-thiobis(6-tert-butyl-o-cresol); 2,6-di-tertbutylphenol; 6-(4-hydroxyphenoxy)-2,4-bis(n-octylthio)-1,3,5 triazine; di-n-octylthio)ethyl 3,5-di-tert-butyl-4-hydroxy-benzoate; and sorbitol hexa[3-(3,5-di-tert-butyl-4-hydroxy-phenyl)-propionate]. Commercial examples of antioxidant are for example Irganox 1035, Irganox 1010, Irganox 1076, Irganox 1098, Irganox 3114, Irganox PS800, Irganox PS802, Irgafos 168 manufactured by BASF.

The weight ratio between siloxane polymer and filler is between 100:0 to 5:95 depending of the final use of the product. The ratio between siloxane polymer and cross-linking silicon or non-silicon based resin or oligomer is between 100:0 to 75:25. The amount of curing agent calculated from siloxane polymer amount is from 0.1 to 20%. The amount of adhesion promoter based on total amount of formulation is from 0 to 10%. The amount of antioxidant based on total weight of the formulation is from 0 to 5%.

The siloxane-particle composition can be used in a variety of areas. It can be used as an adhesive or encapsulant in electronics or optoelectronics packaging, LED and OLED front and back end processing, 3D, photovoltaic and display passivation and insulation, as well as in packaging, printed electronics, power electronics and EMI, touch sensor and other displays, as well as heat or UV curable encapsulants or dielectrics.

Depending upon the type of curing mechanism and catalyst activation the final formulation is cured usually by heating the material to higher temperature. For example if thermal acid generator is used, the material is placed in oven for specific time period. Also possible is curing with electromagnetic radiation, such as UV light.

The molecular weight of the siloxane polymer formed from polymerization of the first and second compounds is from about 300 to 10,000 g/mol, preferably from about 400 to 5000 g/mol, and more preferably from about 500 to 2000 g/mol. The polymer is combined with particles of any desired size, preferably having an average particle size of less than 100 microns, more preferably less than 50 microns, or even less than 20 microns. The siloxane polymer is added at a weight percent of from 10 to 90%, and the particles are added at a weight percent of from 1 to 90%. If the final use of the siloxane material requires optical transparency, the particles may be ceramic particles added at a lower weight percent, such as from 1 to 20% by weight. However, if the particles have an average particle size less than the wavelength of visible light, e.g. preferably less than 400 nm (e.g. less than 200 nm, or even smaller such as less than 100 nm or less than 50 nm average particle size) higher weight percent loadings are possible, such as from 20 to 50%, or greater than 50%, greater than 75%, or even greater than 90%, while still achieving the desired optical transparency (e.g. even at a loading of 75% the optical transmissivity can be greater than 90% or even greater than 95% for visible light).

Polymerization of the first and second compounds is performed, and the particles mixed therewith, to form a viscous fluid having a viscosity of from 50 to 100,000 mPa-sec, preferably from 1000 to 75,000 mPa-sec, and more preferably from 5000 to 50,000 mPa-sec. The viscosity can be measured with a viscometer, such as a Brookfield or Cole-Parmer viscometer, which rotates a disc or cylinder in a fluid sample and measures the torque needed to overcome the viscous resistance to the induced movement. The rotation can be at any desired rate, such as from 1 to 30 rpm, preferably at 5 rpm, and preferably with the material being measured being at 25° C.

After polymerization, any additional desired components can be added to the composition, such as particles, coupling agents, curing agents, etc. The composition is shipped to customers as a viscous material in a container, which may be shipped at ambient temperature without the need for cooling or freezing. As a final product, the material can be applied in the variety of uses mentioned above, typically being heat or UV cured to form a solid cured polymeric siloxane layer.

The composition as disclosed herein is preferably without any substantial solvent. A solvent may be temporarily added, such as to mix a curing agent or other additive with the polymerized viscous material. In such a case, the e.g. curing agent is mixed with a solvent to form a fluid material that can then be mixed with the viscous siloxane polymer. However, as a substantially solvent free composition can sometimes be desirable for shipping to customers, and later application on a customer's device, the solvent that has been temporarily added is removed in a drying chamber. There may however be trace amounts of solvent remaining that were not able to be removed during the drying process, though the composition is substantially free of solvent. This solvent removal aids in the deposition of the composition disclosed herein, by reducing shrinkage during the final curing process, as well as minimizing shrinkage over time during the lifetime of the device, as well as aiding thermal stability of the material during the lifetime of the device. However, as mentioned hereinabove, though no solvent is necessary for the application of the siloxane composition, if very thin layers are desired, it may be desirable to add an organic solvent, non polar or polar (protic or aprotic), so as to provide the siloxane material as a low viscosity liquid in order to minimize the deposited layer's thickness.

Knowing the final application of the composition, the desired viscosity of the composition, and the particles to be included, it is possible to fine tune the siloxane polymer (starting compounds, molecular weight, viscosity, etc.) such that, upon incorporation into the composition having particles and other components, the desired final properties are achieved for subsequent delivery to the customer. Due to the stability of the composition, it is possible to ship the composition at ambient temperature without any substantial change in molecular weight or viscosity, even after a one week, or even one month, time period from making till final use by the customer.

EXAMPLES

The following siloxane polymer examples are given by way of illustration and are not intended to be limitative The viscosity of siloxane polymer was measured by Brookfield viscometer (spindle 14). The molecular weight of the polymer was measured by Agilent GPC.

Siloxane polymer i: A 500 mL round bottom flask with stirring bar and reflux condenser was charged with diphenylsilanediol (60 g, 45 mol %), 2-(3,4-Epoxycyclohexyl) ethyl]trimethoxysilane (55.67 g, 36.7 mol %) and tetramethoxysilane (17.20 g, 18.3 mol %). The flask was heated to 80° C. under nitrogen atmosphere and 0.08 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1000 mPas and Mw of 1100.

Siloxane polymer ii: A 250 mL round bottom flask with stirring bar and reflux condenser was charged with diphenylsilanediol (30 g, 45 mol %), 2-(3,4-Epoxycyclohexyl) ethyl]trimethoxysilane (28.1 g, 37 mol %) and dimethyldimethoxysilane (6.67 g, 18 mol %). The flask was heated to 80° C. under nitrogen atmosphere and 0.035 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 2750 mPas and Mw of 896.

Siloxane polymer iii: A 250 mL round bottom flask with stirring bar and reflux condenser was charged with diphenylsilanediol (24.5 g, 50 mol %), 2-(3,4-Epoxycyclohexyl)ethyl]trimethoxysilane (18.64 g, 33.4 mol %) and tetramethoxysilane (5.75 g, 16.7 mol %). The flask was heated to 80° C. under nitrogen atmosphere and 0.026 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 7313 mPas and Mw of 1328.

Siloxane polymer iv: A 250 mL round bottom flask with stirring bar and reflux condenser was charged with diphenylsilanediol (15 g, 50 mol %), 2-(3,4-Epoxycyclohexyl)ethyl]trimethoxysilane (13.29 g, 38.9 mol %) and bis(t-rimethoxysilyl)ethane (4.17 g, 11.1 mol %). The flask was heated to 80° C. under nitrogen atmosphere and 0.0175 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated under vacuum. The siloxane polymer had viscosity of 1788 mPas and Mw of 1590.

Siloxane polymer v: A 250 mL round bottom flask with stirring bar and reflux condenser was charged with diphenylsilanediol (15 g, 45 mol %), 2-(3,4-Epoxycyclohexyl)ethyl]trimethoxysilane (13.29 g, 35 mol %) and vinyltrimethoxysilane (4.57 g, 20 mol %). The flask was heated to 80° C. under nitrogen atmosphere and 0.018 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 1087 mPas and Mw of 1004.

Siloxane polymer vi: A 250 mL round bottom flask with stirring bar and reflux condenser was charged with di-isopropylsilanediol (20.05 g, 55.55 mol %), 2-(3,4-Epoxycyclohexyl)ethyl]trimethoxysilane (20.0 g, 33.33 mol %) and bis(trimethoxysilyl)ethane (7.3 g, 11.11 mol %). The flask was heated to 80° C. under nitrogen atmosphere and 0.025 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 150 mPas and Mw of 781.

Siloxane polymer vii: A 250 mL round bottom flask with stirring bar and reflux condenser was charged with di-isobutylsilanediol (18.6 g, 60 mol %) and 2-(3,4-Epoxycyclohexyl)ethyl]trimethoxysilane (17.32 g, 40 mol %). The flask was heated to 80° C. under nitrogen atmosphere and 0.019 g of barium hydroxide monohydrate dissolved in 1 mL of methanol was added dropwise to the mixture of silanes. The silane mixture was stirred at 80° C. for 30 min during the diphenylsilanediol reacted with alkoxysilanes. After 30 min, formed methanol was evaporated off under vacuum. The siloxane polymer had viscosity of 75 mPas and Mw of 710.

Examples of end-capped materials:

Example 1

Diphenylsilanediol (100.0 g, 0.46 mol), 3-(Trimethoxysilyl)propyl methacrylate (62.6 g, 0.25 mol), Methyl trimethoxysilane (17.2 g, 0.13 mol) and BaO (0.1 g) in methanol were placed in a 500 mL flask and refluxed for 1 hour. The volatiles were evaporated under reduced pressure and clear resin was obtained.

The weight average molecular weight (Mw) of the polymer was measured by Agilent GPC. The polysiloxane E1 has Mw of 1530 g/mol. FTIR analysis was performed to detect OH-groups and methoxy-groups. The polysiloxane E1 was substantially free of —OH groups (no peak observed at Si—OH band at 3390 cm$^{-1}$). Remaining alkoxy groups can be observed as Si—OCH$_3$ band at 2840 cm$^{-1}$.

Example 2

25 g of polymer resin obtained from Example 1 was dissolved to 50 g acetone. 0.01 M HCl was added until solution was cloudy. Stirring continued at room temperature for 8 hours. Excess of water was added to precipitate polymer and after that polymer obtained was separated and dried. Polymer was dissolved into 30 g methyl tert-butyl ether (MTBE) and 5 g of hexamethyldisilazane was added followed by 0.05 g of pyridine hydrochloride. Stirring continued at room temperature for 24 hours. The non-reacted components were evaporated under reduced pressure and obtained resin was washed by using MTBE-water extractions. The solvent was evaporated under reduced pressure and clear resin (22.9 g) was obtained.

The polysiloxane E2 has Mw of 1670 g/mol. FTIR analysis was performed to detect OH-groups and methoxy-groups. In FTIR analysis, the polysiloxane E2 was substantially free of —OH groups, and Si—OCH$_3$ peak at 2840 cm$^{-1}$ had disappeared.

COMPOSITION EXAMPLES

The following composition examples are given by way of illustration and are not intended to be limitative.

Comparative Example 1, Silver Filled Adhesive

A siloxane polymer with epoxy as a crosslinking functional group (18.3 g, 18.3%), silver flake with average size (D50) of 4 micrometer (81 g, 81%), 3-methacrylatepropyltrimethoxysilane (0.5 g, 0.5%) and King Industries K-PURE CXC-1612 thermal acid generator (0.2%) where mixed together using high shear mixer. The composition has a viscosity of 15000 mPas.

Comparative Example 2, Alumina Filled Adhesive

A siloxane polymer with epoxy as a crosslinking functional group (44.55 g, 44.45%), aluminium oxide with average size (D50) of 0.9 micrometer (53 g, 53%), 3-methacrylatepropyltrimethoxysilane (1 g, 1%), Irganox 1173 (1 g, 1%) and King Industries K-PURE CXC-1612 thermal acid generator (0.45 g, 0.45%) where mixed together using three roll mill. The composition has a viscosity of 20000 mPas.

Comparative Example 3, BN Filled Adhesive

A siloxane polymer with epoxy as a crosslinking functional group (60 g, 60%), boron nitride platelet with average size (D50) of 15 micrometer (35 g, 35%), Irganox 1173 (1.3 g, 1.3%), 2-(3,4-Epoxycyclohexyl)ethyltrimethoxysilane (3.4 g, 3.4%) and King Industries K-PURE CXC-1612 thermal acid generator (0.3 g, 0.3%) where mixed together using three roll mill. The composition has a viscosity of 25000 mPas.

Comparative Example 4, Translucent Material

A siloxane polymer with methacrylate as a functional group (89 g, 89%), fumed silica with average size (D50) of 0.007 micrometer (5 g, 5%), Irganox 1173 (2 g, 2%) and Irgacure 917 photoinitiator (4 g, 4%) where mixed together using three roll mill. The composition has a viscosity of 25,000 mPas.

Comparative Example 5, Transparent Material

Diphenylsilanediol (20.0 g, 92 mmol), 9-phenanthrenyl trimethoxysilane (16.6 g, 56 mmol), 3-methacryloxypropyltrimethoxysilane (9.2 g, 37 mmol) and BaO (25 mg) in methanol were placed in a 100 mL flask and refluxed for 1 hour. The volatiles were evaporated under reduced pressure. Clear polymer resin (37 g) was obtained.

Comparative Example 6, High Refractive Index Material 8.6 g polymer resin having a high index of refraction, prepared as described in Example X1, was blended with 5.7 g ZrO2 nanoparticle solution in 1,2-propanediol monomethyl ether acetate (PGMEA) having a solid content of 50%. 0.26 g photoinitiator (Darocur 1173 by BASF), 0.4 g of oligomeric 3-methacryloxypropyltrimethoxysilane as an adhesion promoter, and 20 mg surfactant (BYK-307 by BYK Chemie) were added to the solution. The obtained material was spin-coated on a 100 mm silicon wafer at 2000 rpm. The film was baked at 80° C. for 5 min on a hot plate and UV-cured with dose of 3000 mJ/cm2. The refractive index was adjusted by altering the weight ratio of polymer resin and the ZrO2 nanoparticle.

TABLE

| Sample | Weight ratio | Refractive index (at 633 nm) | Refractive index (at 450 nm) | Transmittance (%, ca. 30 μm film; at 450 nm) |
|---|---|---|---|---|
| 1. Resin:ZrO2 | 1:0 | 1.61 | 1.64 | 98.6 |
| 2. Resin:ZrO2 | 3:1 | 1.63 | 1.66 | 98.3 |
| 3. Resin:ZrO2 | 1:1 | 1.67 | 1.70 | 97.5 |
| 4. Resin:ZrO2 | 1:3 | 1.72 | 1.75 | 96.1 |

If desired, the refractive index can be selected based on the siloxane particle material chosen. An index of refraction of from 1.25 to 2.0 can be provided, e.g. from 1.4 to 1.7, or other desired number (1.5 to 1.9, 1.5 to 1.65, etc.), with the index of refraction being measured at 632.8 nm wavelength). Higher refractive indices, e.g. those higher than glass such as from 1.6 to 2.0, can be achieved by providing a metal containing monomer to be polymerized into the siloxane polymer. As mentioned above, it is possible to achieve a [Si—O-Me-O]n (where Me is a metal) backbone. Metal containing monomers, with metals such as titanium, tantalum, aluminum, zirconium, hafnium or selenium, among others, can help to increase the index of refraction. Such metal containing monomers can be used in place of the first, second or third compounds as mentioned hereinabove, or as an addition thereto.

Also, it is possible to increase the index of refraction based on the selection of particles (alternatively or in addition to the incorporation of metal into the siloxane polymer as mentioned above). Particular oxide particles, such as oxides of titanium, tantalum, aluminum, zirconium, hafnium or selenium, among others, can help to increase the refractive index. In addition, a coupling agent that improves the incorporation of the particles into the siloxane polymer can be selected to aid in the increase of the refractive index. As one example, a coupling agent having the chemical formula $(R^{16}Ar)_iSiR^1_j$ where i=1 or 2, and j=4-1, where $R_{16}$ is a functional cross linking group that undergoes cross linking with the siloxane polymer upon the application of heat or UV light, where Ar is an aryl group, and where $R_1$ is a reactive group, such as a hydroxyl, halogen, alkoxy, carboxyl, amine or acyloxy group. As such the compound comprises a silicon atom bonded to one or two aryl groups (which aryl groups have a cross-linking substitutent) and where the silicon atom is also bonded to two or three reactive groups, preferably alkoxy groups. The aryl group can be phenyl, naphthalene, phenanthrene, anthracene, etc and the $R_{16}$ functional cross-linking group can be epoxy, acrylate, vinyl, allyl, acetylene, alcohol, amine, thiol, silanol, etc. The coupling agent may also be selected to have a metal atom, such as titanium, tantalum, aluminum, zirconium, hafnium or selenium etc in place of silicon.

Figure 7:
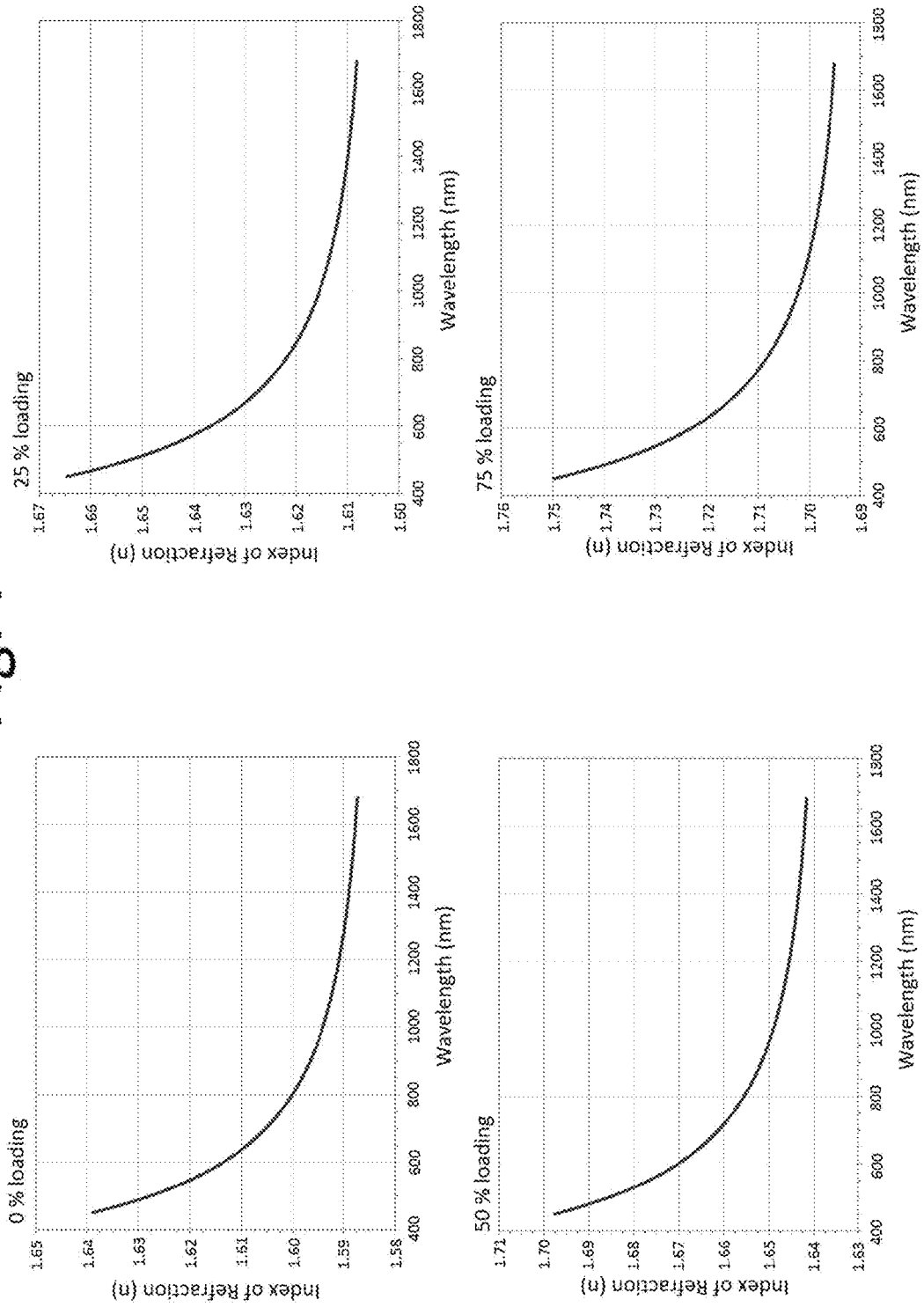
FIG. 7 shows graphs of refractive index vs wavelength for different particle loadings.
Figure 8:
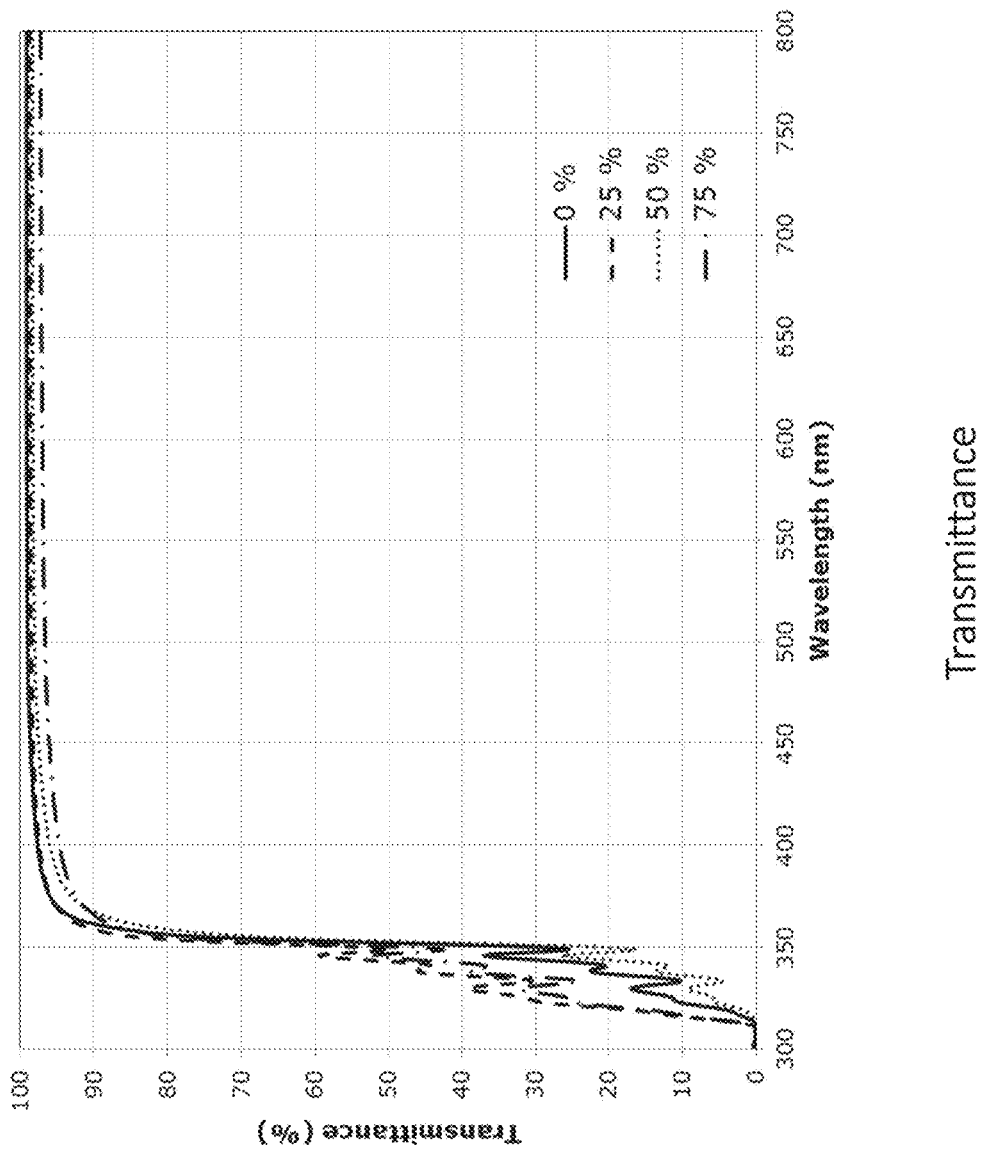
FIG. 8 is a graph of the transmittance vs particle loading.

As can be seen in FIG. 7, the index of refraction of the cured siloxane particle material as disclosed herein is plotted vs wavelength of light, and with each graph having a different amount of particles as part of the siloxane material—from no particles added to the composition, to 75% loading. As can be seen in FIG. 7, an index of refraction of 1.60 or more in the visible spectrum can be achieved with no particles, and an index of refraction in the visible spectrum of 1.70 or more can be achieved with particles in this example. As can be seen in FIG. 8, the % transmittance of the siloxane material is plotted vs. wavelength of light. As illustrated in this figure, different loadings of particles, from no particles to 75% are plotted and in the visible spectrum have a % transmittance of visible light of greater than 90% (in fact greater than 95%). As such, the siloxane material even loaded with a high % of particles, is very transparent and useful in a variety of optical applications.

In view of the disclosed methods and materials, a stable composition is formed. The composition may have one part that is a siloxane polymer having a [—Si—O—Si—O]n repeating backbone, with alkyl or aryl groups thereon, and functional cross-linking groups thereon, and another part that is particles mixed with the siloxane material, wherein the particles have an average particle size of less than 100 microns, the particles being any suitable particles though preferably are ceramic particles, such as nitride or oxide particles, and preferably nanoparticles having an average particle size less than the range of visible light—e.g. less than 400 nm. The composition as shipped to customers may have a molecular weight of from 300 to 10,000 g/mol, and a viscosity of from 1000 to 75,000 mPa-sec at 5 rpm viscometer.

The viscous (or liquid) siloxane polymer is substantially free of —OH groups, thus providing increased shelf-life, and allowing for storing or shipping at ambient temperature if desired. Preferably, the siloxane material has no —OH peak detectable from FTIR analysis thereof. The increased stability of the formed siloxane material allows for storage prior to use where there is a minimal increase in viscosity (cross-linking) during storage, such as less than 25% over the period of 2 weeks, preferably less than 15%, and more preferably less than 10% over a 2 week period stored at room temperature. And, the storage, shipping and later application by the customer can be all performed in the absence of a solvent (except for possible trace residues that remain after drying to remove the solvent), avoiding the problems of solvent capture in the layer later formed in the final product, shrinkage during polymerization, mass loss over time during device usage, etc. No substantial cross-linking occurs during shipping and storage, without the application of heat preferably greater than 100 C or UV light. The composition as well as the finally is substantially in the absence of Si—H bonds.

Figure 9:
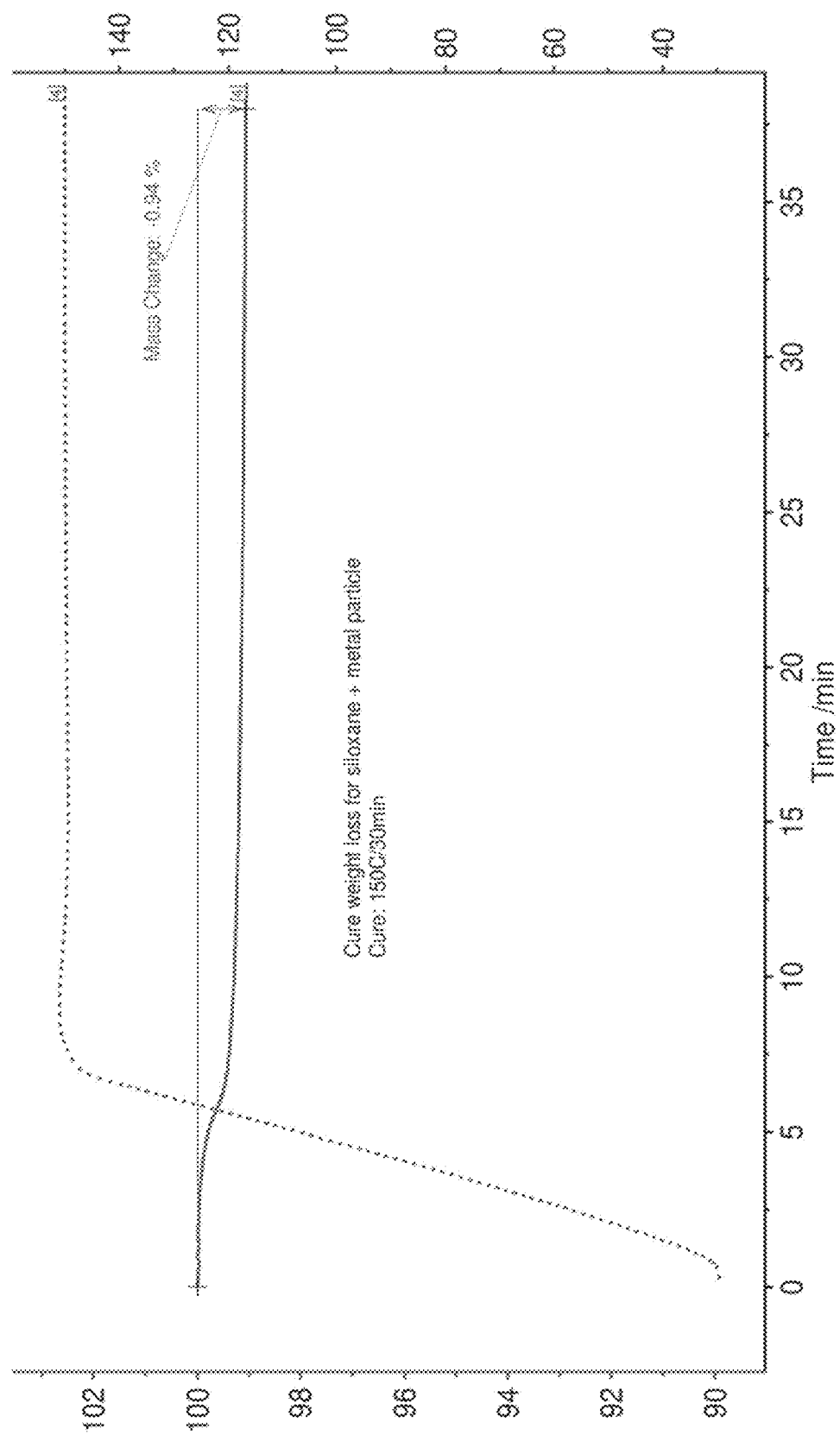
FIG. 9 illustrates mass change of the siloxane polymer during heat induced polymerization.

When the composition is deposited and polymerized, e.g. by the application of heat or UV light, very small shrinkage or reduction in mass is observed. In FIG. 9, the x-axis is time (in minutes), the left y axis is the mass of the layer in terms of % of the starting mass, and the right y-axis is temperature in Celsius. As can be seen in FIG. 9, a siloxane particle mixture as disclosed herein is heated rapidly to 150° C., then held at 150° C. for approximately 30 minutes. In this example, the siloxane particle has a Si—O backbone with phenyl group and epoxy groups, and the particles are silver particles. The mass loss is less than 1% after heat curing for over this time period. Desirably the mass loss is typically less than 4%, and generally less than 2%—however in many cases the difference in mass of the siloxane particle composition between before and after curing is less than 1%. The curing temperature is generally at less than 175° C., though higher curing temperatures are possible. Typically the curing temperature will be at 160° C. or below, more typically at 150° C. or below. However lower curing temperatures are possible, such as at 125° C. or below.

Figure 10:
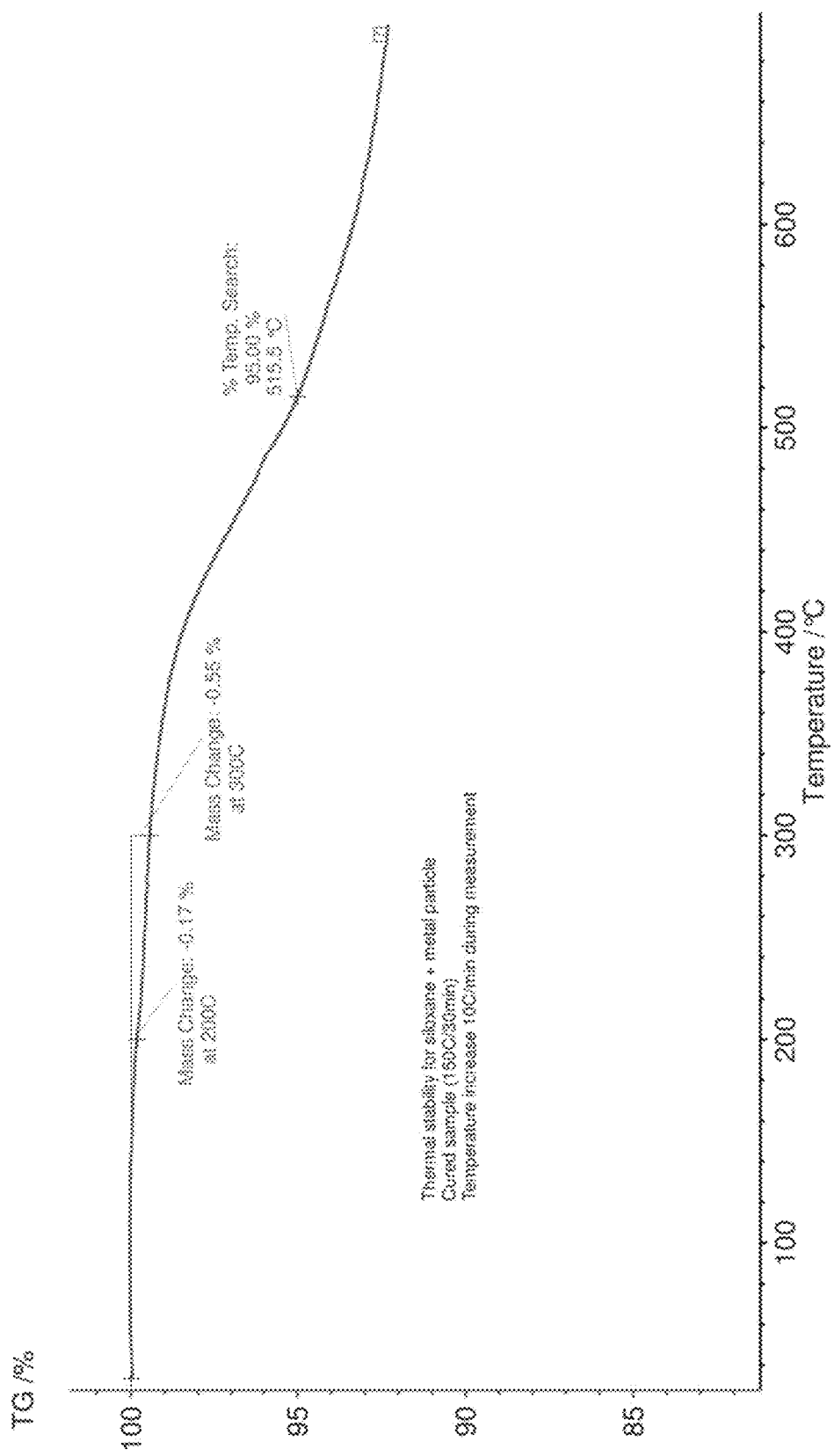
FIG. 10 illustrates the thermal stability of the siloxane material after deposition and polymerization.

As can be seen in FIG. 10, regardless of whether the composition disclosed above is used as an adhesive, as a thermally conductive layer, as an encapsulant, as a patterned electrically conductive layer, a patterned dielectric layer, a transparent layer, a light reflecting layer, etc., once the composition is deposited and polymerized and hardened as desired, the siloxane particle layer or mass is thermally very stable. As an example, heating the in situ material after hardening by heat or UV polymerization up to 600° C. at a ramp rate of 10° C. increase per minute, a mass loss of less than 4.0%, preferably less than 2.0%, e.g. less than 1.0% is observed at both 200° C. and 300° C. (typically a mass loss of less than 0.5% is observed at 200° C., or as in the example of FIG. 10, a mass loss of less than 0.2% at 200° C. is observed). At 300° C., a mass loss of less than 1% is observed in the example of FIG. 10, or more particularly less than 0.6%. Similar results can be observed by simply heating the polymerized material for 1 hour at 200° C., or at 300° C. Results of less than 1% mass loss by heating the polymerized deposited material at 375° C. or more for at least 1 hour are possible. As can be seen in FIG. 10, even at temperatures of greater than 500° C., a mass loss of 5% or less is observed. Such a thermally stable material is desirable, particularly one as disclosed herein that can be deposited at low temperatures (e.g. less than 175° C., preferably less than 150° C., or less than 130° C. at e.g. 30 min curing/baking time), or that can be polymerized by UV light.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

INDUSTRIAL APPLICABILITY

The present compositions can be used in semiconductor devices and microelectronic and optoelectronic devices, such as displays, for example LED displays such as OLED/AMOLED, and LCD displays. Examples include touch-screen displays, such as resistive or capacitive touchscreens for smartphones, tablets, laptops and notebooks, computer monitors, as well as touchscreens on digital cameras, camcorders, portable game devices, personal multimedia players, e-book readers, printers, automotive displays, GPS/PND navigation devices, etc as well as touchscreens in retail, commercial and industrial environments. However non-touchscreen versions benefit from the siloxane particle insulating and light transmissive materials as disclosed herein.

REFERENCE SIGNS LIST

1 a polarizer layer
2 substrate
3 thin film transistor array
4 an array of liquid crystal cells
5 VCOM layer 5 (electrode)
6 color filter
7 glass substrate
8 patterned electrically conductive layer
9 insulating layer
10 patterned electrically conductive layer
11 a second polarizer
12 adhesive layer
13 cover glass
21 polarizing layer
22 glass substrate
23 thin film transistor array
24, 26 electrically conductive layer
25 insulating layer
27 LCD cells
28 color filters
29 transparent substrate
30 polarizing layer
31 adhesive layer
32 additional transparent substrate
50 transmissive substrate
51 transparent electrically conductive layer
52 electrically conductive jumper
53 dielectric layer
54 metal traces
55 electrically conductive pattern
56 passivation layer
57 additional dielectric over coat
70 substrate
72*a* exposed area
72*b* unexposed area
75 mask
80 substrate
82 electrically conducting layer
82*a* electrically conducting portion
82*b* groove
85 mask
86 UV light

CITATION LIST

Patent Literature

US 20110051064
U.S. Pat. No. 5,645,901
KR 20120119020

What is claimed is:

1. A dielectric film comprising:
   formed on a supporting substrate, a dielectric layer comprising a siloxane polymer and particles within the siloxane polymer and having an average particle size of less than 1 micron;
   wherein the dielectric layer is optically transmissive to visible light and transmits at least 75% of the light incident thereon; and
   wherein the dielectric layer is electrically insulating and has a sheet resistance of 1000 Ω/sq or more, and
   wherein the dielectric film has substantially no —OH groups in the siloxane polymer and has substantially no —H groups directly bonded to Si in the siloxane polymer.

2. The dielectric film of claim 1, wherein the sheet resistance is $1 \times 10^5$ Ω/sq.

3. The dielectric film of claim 1, having a refractive index of 1.5 to 2.0.

4. The dielectric film of claim 1, wherein the particles are ceramic particles.

5. The dielectric film of claim 1, wherein particles are nanoparticles having an average particle size of 400 nm or less.

6. The dielectric film of any of claim 4, wherein the particles comprise an oxide of silicon, zinc, aluminum, yttrium, tungsten, titanium-silicon, titanium, antimony, nickel, nickel cobalt, molybdenum, magnesium, manganese, any lanthanide, iron, indium tin, copper, cobalt aluminum, chromium, cesium or calcium; or wherein the particles are aluminum nitride, tantalum nitride, boron nitride, titanium nitride, copper nitride, molybdenum nitride, tungsten nitride, iron nitride, silicon nitride, indium nitride, gallium nitride or carbon nitride.

7. The dielectric film of claim 4, wherein the particles are nanoparticles having an average particle size of less than 400 nm and wherein the nanoparticles are an oxide of titanium, tantalum, aluminum, zirconium, hafnium or selenium.

8. The dielectric film of claim 1, wherein the particles are silica, hollow silica, $ZrO_2$, ZrO, $TiO_2$, $Ta_2O_5$, antimony tin oxide, or $SnO_2$, which film transmits at least 85% of the visible light incident thereon.

9. The dielectric film of claim 1, wherein the substrate comprises glass, quartz, sapphire, organic polymer or hybrid organic-inorganic polymer, polyethylene terephthalate, or polymethyl methacrylate.

10. The dielectric film of claim 1, which is part of a display or part of an OLED device.

11. The dielectric film of claim 1, wherein the siloxane polymer comprises organic aryl group.

12. The dielectric film of claim 1, having a refractive index of from 1.6 to 1.9, and wherein the film is thermally stable and if heated to at least 200° C. would have a mass loss of less than 4%.

13. The dielectric film of claim 1, which is an adhesive in a touchscreen display.

14. A method for making a dielectric film, comprising:
   providing a substrate; and
   depositing on the substrate a composition having a siloxane starting material and particles;
   wherein the siloxane starting material comprises a siloxane polymer, a siloxane oligomer and/or silane monomers, and wherein the particles have an average particle size of less than 400 nm;
   wherein heat and/or electromagnetic energy is applied to the siloxane particle layer so as to cure the layer and form a dielectric film on the substrate;
   wherein the film is optically transmissive to visible light and transmits at least 80% of the visible light incident thereon; and wherein the film is electrically insulating and has a sheet resistance of 1000 Ω/sq or more, said siloxane starting material being substantially free of hydrogen directly bonded to silicon and substantially free of —OH groups.

15. The method of claim 14, wherein the siloxane starting material is deposited together with the particles on the substrate in the absence of a solvent, wherein the particles are oxide nanoparticles having an average particle size of less than 200 nm and where the film has a refractive index of from 1.6 to 1.9.

16. The method of claim 14, wherein the siloxane starting material comprises organic groups selected from aryl and/or alkyl groups bound to Si in the siloxane backbone.

17. The method of claim 14, wherein a mass loss of the siloxane composition before and after curing is less than 4%.

18. The method of claim 14, wherein the siloxane starting material is a photo-crosslinkable polymer, and wherein the siloxane starting material comprises a siloxane polymer, a silane monomer, and an additive, and wherein the additive comprises a reducing agent, a surfactant, a stabilizer, an adhesion promoter, and/or an antioxidant.

19. The method of claim 14, wherein the siloxane starting material on the substrate is exposed to ultraviolet (UV) light via a mask or patterned photoresist layer, so as to form hardened areas exposed to the UV light surrounded by softer areas in the non-exposed areas, followed by selectively removing the non-exposed areas to form a patterned dielectric film.

20. The method of claim 14, wherein the particles comprise an oxide of silicon, zinc, aluminum, yttrium, ytterbium, tungsten, titanium-silicon, titanium, antimony, samarium, nickel, nickel cobalt, molybdenum, magnesium, manganese, lanthanide, iron, indium tin, copper, cobalt aluminum, chromium, cesium or calcium, wherein the refractive index of the film is from 1.6 to 1.9, and wherein the particles have an average particle size of less than 50 nm.

21. The method of claim 14, wherein the siloxane starting material comprises phenyl and a methacrylate functional reactive group, and wherein the particles are ceramic oxide nanoparticles and have an average particle size of less than 400 nm.

22. The method of claim 14, wherein the siloxane starting material is soft baked, followed by selective exposure to ultraviolet light, followed by removal of selected areas with a developer.

23. The method of claim 14, wherein the siloxane starting material is heat cured at a temperature of less than 120° C.

24. The method of claim 14, wherein the siloxane starting material is heat cured at a temperature of less than 125° C. and cured with ultraviolet light; or wherein the siloxane starting material is heat cured at a temperature of less than 100° C. and without the application of ultraviolet light.

25. The method of claim 14, wherein the siloxane starting material comprises functional cross-linking groups that are independently alkene, alkyne, epoxy, oxetane, or acrylate groups.

26. A display comprising:
a plurality of pixels in a matrix, the pixels each comprising a liquid crystal layer and/or light emitting diode layer,
a plurality of substrates that are optically transmissive to visible light;
an adhesive layer for bonding a first substrate to a second substrate and being formed from an electrically insulating material that has a sheet resistance of more than 1000 Ω/sq and that comprises a siloxane material and particles having an average particle size of less than 400 nm,
and, wherein the electrically insulating material is thermally stable where if heated to at least 200° C. the electrically insulating material has a mass loss of less than 2%.

27. The display of claim 26, wherein the electrically insulating material is an optically transmissive layer that transmits at least 85% of the visible light incident thereon, and wherein the electrically insulating material has a sheet resistance of 10000 Ω/sq.

28. The display of claim 26, wherein the particles are nitride particles selected from aluminum nitride, tantalum nitride, boron nitride, titanium nitride, copper nitride, molybdenum nitride, tungsten nitride, iron nitride, silicon nitride, indium nitride, gallium nitride or carbon nitride, or the particles are oxide nanoparticles comprising an oxide of silicon, zinc, aluminum, yttrium, ytterbium, tungsten, titanium-silicon, titanium, antimony, samarium, nickel, nickel cobalt, molybdenum, magnesium, manganese, lanthanide, iron, indium tin, copper, cobalt aluminum, chromium, cesium or calcium.

29. The display of claim 26, wherein the particles comprise an oxide of titanium, tantalum, aluminum, zirconium, hafnium or selenium, and a refractive index of the electrically insulating material is from 1.6 to 1.9.

30. The display of claim 26, wherein the siloxane material is a siloxane polymer that comprises aryl or alkyl groups and wherein the particles comprise a transition metal oxide, and have an average particle size of less than 100 nm.

31. The display of claim 26, wherein the plurality of substrates comprise a first substrate having liquid crystal elements thereon, a second substrate comprising a capacitive touch sensor thereon, and a third substrate that is a cover substrate wherein the pixels are twisted nematic liquid crystals.

32. The display of claim 26, further comprising a second adhesive layer and a third substrate, wherein the second adhesive layers bonds the second and third substrates together.

33. The display of claim 26, wherein the pixels are light emitting diode (LED) pixels and the first substrate is a flexible polymeric substrate and the display is an OLED display.

34. The display of claim 26, which is a touch panel display.

35. A method for making a display comprising,
providing a first substrate having an array of pixel elements thereon, wherein the pixel elements each comprise a liquid crystal material and/or light emitting diode material;
providing a second substrate that is a cover substrate; and
adhering the first and second substrates together with an adhesive;
wherein the adhesive is comprised of an electrically insulating material that has an electrical resistivity of more than 1000 Ω/sq and that comprises a siloxane material and particles having an average particle size of less than 400 nm;
wherein the first and second substrates are bonded together by applying heat and/or ultraviolet light so as to cure and harden the siloxane material therebetween,
wherein the siloxane material is substantially free of —OH groups, and substantially free of Si—H bonds.

36. The method of claim 35, wherein the curing is under the application of ultraviolet light, or the curing is under the application of heat at from 120° C. to 150° C.

37. The method of claim 35, wherein the curing comprises soft baking the siloxane particle material, UV patterning the siloxane particle material, and selectively removing portions of the siloxane particle material so as to leave an electrically insulating pattern, the curing comprises UV patterning the siloxane particle material by the application of UV light via a mask or resist layer.

38. The method of claim 35, which is a roll-to-roll process and wherein the first substrate is a flexible substrate provided from a roll.

39. The method of claim 35, wherein the second substrate is a flexible substrate provided from a second roll and for bonding to the first substrate, and wherein the first and second substrates are transparent polymeric materials.

40. The method of claim 35, wherein the siloxane material comprises aryl groups, and wherein the aryl groups are phenyl groups directly bound to silicon in the siloxane material.

* * * * *